(12) United States Patent
Lu et al.

(10) Patent No.: US 12,112,816 B2
(45) Date of Patent: Oct. 8, 2024

(54) FLASH MEMORY SCHEME CAPABLE OF CONTROLLING FLASH MEMORY DEVICE AUTOMATICALLY GENERATING DEBUG INFORMATION AND TRANSMITTING DEBUG INFORMATION BACK TO FLASH MEMORY CONTROLLER WITH MAKING MEMORY CELL ARRAY GENERATING ERRORS

(71) Applicant: Silicon Motion, Inc., Hsinchu County (TW)

(72) Inventors: Tsu-Han Lu, Hsinchu (TW); Hsiao-Chang Yen, Hsinchu County (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 18/094,989

(22) Filed: Jan. 10, 2023

(65) Prior Publication Data
US 2024/0233849 A1    Jul. 11, 2024

(51) Int. Cl.
*G11C 29/12*    (2006.01)

(52) U.S. Cl.
CPC .... *G11C 29/12005* (2013.01); *G11C 29/1201* (2013.01)

(58) Field of Classification Search
None
See application file for complete search history.

(56) References Cited

U.S. PATENT DOCUMENTS

| 6,724,680 | B1 | 4/2004 | Ng |
| 9,720,797 | B2 | 8/2017 | Broderick |
| 10,289,303 | B2 | 5/2019 | Li |
| 2011/0063909 | A1* | 3/2011 | Komatsu ................ G11C 29/28 365/185.11 |

(Continued)

FOREIGN PATENT DOCUMENTS

| CN | 102272731 A | 12/2011 |
| CN | 104750535 B | 8/2018 |

(Continued)

OTHER PUBLICATIONS

Lu, the specification, including the claims, and drawings in the U.S. Appl. No. 18/094,986, filed Jan. 10, 2023.

(Continued)

*Primary Examiner* — Guerrier Merant
(74) *Attorney, Agent, or Firm* — Winston Hsu

(57) ABSTRACT

A flash memory controller to be used in a storage device and coupled to a flash memory device of the storage device through a specific communication interface. The flash memory controller sends an error injection access command signal to the flash memory device through the specific communication interface to configure an operation of a debug circuit of the flash memory device to make the debug circuit automatically generate debug information of an access operation of the error injection access command signal sent from the flash memory controller, transmit the generated debug information from the flash memory device to the flash memory controller via the I/O control circuit and the specific communication interface, with controlling a memory cell array of flash memory device generating failure errors.

8 Claims, 14 Drawing Sheets

(56) References Cited

U.S. PATENT DOCUMENTS

| | | |
|---|---|---|
| 2012/0216079 A1 | 8/2012 | Fai |
| 2013/0212425 A1 | 8/2013 | Blaine |
| 2015/0106662 A1 | 4/2015 | Atri |
| 2017/0004063 A1 | 1/2017 | Broderick |
| 2017/0062077 A1* | 3/2017 | Kada ............... G11C 29/42 |
| 2018/0217752 A1 | 8/2018 | Li |
| 2019/0237151 A1* | 8/2019 | Cho ............... G11C 29/02 |

FOREIGN PATENT DOCUMENTS

| | | |
|---|---|---|
| CN | 112349336 A | 2/2021 |
| CN | 114546292 A | 5/2022 |

OTHER PUBLICATIONS

Lu, the specification, including the claims, and drawings in the U.S. Appl. No. 18/094,990 , filed Jan. 10, 2023.
Lu, the specification, including the claims, and drawings in the U.S. Appl. No. 18/094,994 , filed Jan. 10, 2023.

* cited by examiner

P1 and P2: maximum erase failure block count
P3 and P4: maximum program failure block count

FLASH MEMORY SCHEME CAPABLE OF CONTROLLING FLASH MEMORY DEVICE AUTOMATICALLY GENERATING DEBUG INFORMATION AND TRANSMITTING DEBUG INFORMATION BACK TO FLASH MEMORY CONTROLLER WITH MAKING MEMORY CELL ARRAY GENERATING ERRORS

BACKGROUND OF THE INVENTION

1. Field of the Invention

The invention relates to a flash memory control scheme, and more particularly to a flash memory controller, a flash memory device, and a corresponding method.

2. Description of the Prior Art

Generally speaking, a conventional flash memory controller controls its hardware component generating debug information of a program failure test, a cache program failure test, or an erase failure test when it enters a debug mode, and then it controls its firmware component to check the debug information so as to perform an error handle operation. That is, the procedure of the generation and checking of the debug information is merely processed by the conventional flash memory controller by itself, and is not involved with a flash memory device externally coupled to the conventional flash memory controller. The test result may be unreliable.

SUMMARY OF THE INVENTION

Therefore one of the objectives of the invention is to provide a flash memory controller, a flash memory device, and a corresponding method, to solve the above-mentioned problems.

According to embodiments of the invention, a flash memory device to be used in a storage device and coupled to a flash memory controller of the storage device through a specific communication interface is disclosed. The flash memory device comprises an input/output (I/O) control circuit, a command register, an address register, a memory cell array, at least one address decoder, a status register, a voltage generator, and a control circuit having a debug circuit. The input/output (I/O) control circuit is coupled to the flash memory controller through the specific communication interface. The command register is coupled to the I/O control circuit, and is used for buffering command information sent from the flash memory controller and transmitted through the I/O control circuit. The address register is coupled to the I/O control circuit, and is used for buffering address information sent from the flash memory controller and transmitted through the I/O control circuit. The memory cell array at least has a first plane and a second plane which is different from the first plane. The at least one address decoder is coupled to the memory cell array. The status register is coupled to the I/O control circuit. The voltage generator is coupled to the memory cell array. The control circuit is coupled to the logic control circuit, the memory cell array, the address register, the command register, and the status register, and is used for automatically generating debug information of an access operation of an access command signal sent from the flash memory controller, transmitting the generated debug information into the status register, and controlling the status register transmitting the debug information from the flash memory device to the flash memory controller via the I/O control circuit and the specific communication interface, without controlling the voltage generator making the memory cell array generate errors. The access operation is a program operation, a cache program operation, or an erase operation; the debug information is associated with a simulated program failure, a simulated cache program failure, or a simulated erase failure, and the debug circuit does not control the memory cell array generating a program failure error, a cache program failure error, or an erase failure error.

According to the embodiments, a method of a flash memory device to be used in a storage device and coupled to a flash memory controller of the storage device through a specific communication interface is disclosed. The method comprises: providing an input/output (I/O) control circuit, coupled to the flash memory controller through the specific communication interface; providing a command register, coupled to the I/O control circuit, for buffering command information sent from the flash memory controller and transmitted through the I/O control circuit; providing an address register, coupled to the I/O control circuit, for buffering address information sent from the flash memory controller and transmitted through the I/O control circuit; providing a memory cell array, at least having a first plane and a second plane which is different from the first plane; providing at least one address decoder, coupled to the memory cell array; providing a status register, coupled to the I/O control circuit; providing a voltage generator, coupled to the memory cell array; using a debug circuit to automatically generate debug information of an access operation of an access command signal sent from the flash memory controller without controlling the voltage generator making the memory cell array generate errors; and, transmitting the generated debug information into the status register and controlling the status register transmitting the debug information from the flash memory device to the flash memory controller via the I/O control circuit and the specific communication interface. The access operation is a program operation, a cache program operation, or an erase operation; the debug information is associated with a simulated program failure, a simulated cache program failure, or a simulated erase failure, and the debug circuit does not control the memory cell array generating a program failure error, a cache program failure error, or an erase failure error.

According to the embodiments, a flash memory controller to be used in a storage device and coupled to a flash memory device of the storage device through a specific communication interface is disclosed. The method comprises an input/output (I/O) circuit and a processor. The I/O circuit is coupled to the flash memory device through the specific communication interface, and is used for sending commands and data between the flash memory device and a processor. The processor is coupled to the I/O circuit, and is used for controlling the I/O circuit sending a debug injection set-feature signal to the flash memory device through the specific communication interface to configure an operation of a debug circuit of the flash memory device to make the debug circuit automatically generate debug information of an access operation of an access command signal sent from the flash memory controller, transmit the generated debug information from the flash memory device to the flash memory controller via the I/O control circuit and the specific communication interface, without controlling a memory cell array of flash memory device generating errors. The access operation is a program operation, a cache program operation, or an erase operation; the debug information is associated with a simulated program failure, a simulated cache program failure, or a simulated erase failure, and the debug circuit does not control the memory cell array generating a program failure error, a cache program failure error, or an erase failure error.

According to embodiments of the invention, a flash memory device to be used in a storage device and coupled to a flash memory controller of the storage device through a specific communication interface is disclosed. The flash memory device comprises an input/output (I/O) control circuit, a command register, an address register, a memory cell array, at least one address decoder, a status register, a voltage generator, and a control circuit having a debug circuit. The input/output (I/O) control circuit is coupled to the flash memory controller through the specific communication interface. The command register is coupled to the I/O control circuit, and is used for buffering command information sent from the flash memory controller and transmitted through the I/O control circuit. The address register is coupled to the I/O control circuit, and is used for buffering address information sent from the flash memory controller and transmitted through the I/O control circuit. The memory cell array at least has a first plane and a second plane which is different from the first plane. The at least one address decoder is coupled to the memory cell array. The status register is coupled to the I/O control circuit. The voltage generator is coupled to the memory cell array. The control circuit is coupled to the logic control circuit, the memory cell array, the address register, the command register, and the status register, and is used for automatically generating a debug information of an access operation of an access command signal sent from the flash memory controller, transmitting the generated debug information into the status register, and controlling the status register transmitting the debug information from the flash memory device to the flash memory controller via the I/O control circuit and the specific communication interface, with actually controlling the voltage generator making the memory cell array generate failure errors. The access operation is a program operation, a cache program operation, or an erase operation; the debug information is associated with a true program failure, a true cache program failure, or a true erase failure, and the debug circuit controls the memory cell array generating a program failure error, a cache program failure error, or an erase failure error.

According to the embodiments, a method of a flash memory device to be used in a storage device and coupled to a flash memory controller of the storage device through a specific communication interface is disclosed. The method comprises: providing an input/output (I/O) control circuit, coupled to the flash memory controller through the specific communication interface; providing a command register, coupled to the I/O control circuit, for buffering command information sent from the flash memory controller and transmitted through the I/O control circuit; providing an address register, coupled to the I/O control circuit, for buffering address information sent from the flash memory controller and transmitted through the I/O control circuit; providing a memory cell array, at least having a first plane and a second plane which is different from the first plane; providing at least one address decoder, coupled to the memory cell array; providing a status register, coupled to the I/O control circuit; providing a voltage generator, coupled to the memory cell array; using a debug circuit to automatically generate debug information of an access operation of an access command signal sent from the flash memory controller with actually controlling the voltage generator making the memory cell array generate failure errors; and, transmitting the generated debug information into the status register and controlling the status register transmitting the debug information from the flash memory device to the flash memory controller via the I/O control circuit and the specific communication interface. The access operation is a program operation, a cache program operation, or an erase operation; the debug information is associated with a true program failure, a true cache program failure, or a true erase failure, and the debug circuit controls the memory cell array generating a program failure error, a cache program failure error, or an erase failure error.

According to the embodiments, a flash memory controller to be used in a storage device and coupled to a flash memory device of the storage device through a specific communication interface is disclosed. The method comprises an input/output (I/O) circuit and a processor. The I/O circuit is coupled to the flash memory device through the specific communication interface, and is used for sending commands and data between the flash memory device and a processor. The processor is coupled to the I/O circuit, and is used for controlling the I/O circuit sending an error injection set-feature signal to the flash memory device through the specific communication interface to configure an operation of a debug circuit of the flash memory device to make the debug circuit automatically generate debug information of an access operation of an access command signal sent from the flash memory controller, transmit the generated debug information from the flash memory device to the flash memory controller via the I/O control circuit and the specific communication interface, with actually controlling a memory cell array of flash memory device generating failure errors. The access operation is a program operation, a cache program operation, or an erase operation; the debug information is associated with a true program failure, a true cache program failure, or a true erase failure, and the debug circuit controls the memory cell array generating a program failure error, a cache program failure error, or an erase failure error.

According to the embodiments of the invention, a flash memory device to be used in a storage device and coupled to a flash memory controller of the storage device through a specific communication interface is disclosed. The flash memory device comprises an input/output (I/O) control circuit, a command register, an address register, a memory cell array, at least one address decoder, a status register, a voltage generator, and a control circuit having a debug circuit. The input/output (I/O) control circuit is coupled to the flash memory controller through the specific communication interface. The command register is coupled to the I/O control circuit, and is used for buffering command information sent from the flash memory controller and transmitted through the I/O control circuit. The address register is coupled to the I/O control circuit, and is used for buffering address information sent from the flash memory controller and transmitted through the I/O control circuit. The memory cell array at least has a first plane and a second plane which is different from the first plane. The at least one address decoder is coupled to the memory cell array. The status register is coupled to the I/O control circuit. The voltage generator is coupled to the memory cell array. The control circuit is coupled to the logic control circuit, the memory cell array, the address register, the command register, and the status register, and is used for automatically generating debug information of an access operation in response to a reception of a debug injection command signal sent from the flash memory controller, transmitting the generated debug information into the status register, and controlling the status register transmitting the debug information from the flash memory device to the flash memory controller via the I/O control circuit and the specific communication interface, without controlling the voltage generator making the memory cell array generate errors. The access operation is a program operation, a cache program operation, or an erase operation; the debug information is associated with a simulated program failure, a simulated cache program failure, or a simulated erase failure, and the debug circuit does not control the memory cell array generating a program failure error, a cache program failure error, or an erase failure error.

According to the embodiments, a method of a flash memory device to be used in a storage device and coupled to a flash memory controller of the storage device through a specific communication interface is disclosed. The method comprises: providing an input/output (I/O) control circuit, coupled to the flash memory controller through the specific communication interface; providing a command register, coupled to the I/O control circuit, for buffering command information sent from the flash memory controller and transmitted through the I/O control circuit; providing an address register, coupled to the I/O control circuit, for buffering address information sent from the flash memory controller and transmitted through the I/O control circuit; providing a memory cell array, at least having a first plane and a second plane which is different from the first plane; providing at least one address decoder, coupled to the memory cell array; providing a status register, coupled to the I/O control circuit; providing a voltage generator, coupled to the memory cell array; using a debug circuit to automatically generate debug information of an access operation in response to a reception of a debug injection command signal sent from the flash memory controller without controlling the voltage generator making the memory cell array generate errors; and, transmitting the generated debug information into the status register and controlling the status register transmitting the debug information from the flash memory device to the flash memory controller via the I/O control circuit and the specific communication interface. The access operation is a program operation, a cache program operation, or an erase operation; the debug information is associated with a simulated program failure, a simulated cache program failure, or a simulated erase failure, and the debug circuit does not control the memory cell array generating a program failure error, a cache program failure error, or an erase failure error.

According to the embodiments, a flash memory controller to be used in a storage device and coupled to a flash memory device of the storage device through a specific communication interface is disclosed. The method comprises an input/output (I/O) circuit and a processor. The I/O circuit is coupled to the flash memory device through the specific communication interface, and is used for sending commands and data between the flash memory device and a processor. The processor is coupled to the I/O circuit, and is used for controlling the I/O circuit sending a debug injection command signal to the flash memory device through the specific communication interface to make the debug circuit automatically generate debug information of an access operation in response to a reception of the debug injection command signal sent from the flash memory controller, for transmitting the generated debug information from the flash memory device to the flash memory controller via the I/O control circuit and the specific communication interface, without controlling a memory cell array of flash memory device generating errors. The access operation is a program operation, a cache program operation, or an erase operation; the debug information is associated with a simulated program failure, a simulated cache program failure, or a simulated erase failure, and the debug circuit does not control the memory cell array generating a program failure error, a cache program failure error, or an erase failure error.

According to embodiments of the invention, a flash memory device to be used in a storage device and coupled to a flash memory controller of the storage device through a specific communication interface is disclosed. The flash memory device comprises an input/output (I/O) control circuit, a command register, an address register, a memory cell array, at least one address decoder, a status register, a voltage generator, and a control circuit having a debug circuit. The input/output (I/O) control circuit is coupled to the flash memory controller through the specific communication interface. The command register is coupled to the I/O control circuit, and is used for buffering command information sent from the flash memory controller and transmitted through the I/O control circuit. The address register is coupled to the I/O control circuit, and is used for buffering address information sent from the flash memory controller and transmitted through the I/O control circuit. The memory cell array at least has a first plane and a second plane which is different from the first plane. The at least one address decoder is coupled to the memory cell array. The status register is coupled to the I/O control circuit. The voltage generator is coupled to the memory cell array. The control circuit is coupled to the logic control circuit, the memory cell array, the address register, the command register, and the status register, and is used for automatically generating debug information of an access operation in response to a reception of an error injection command signal sent from the flash memory controller, transmitting the generated debug information into the status register, and controlling the status register transmitting the debug information from the flash memory device to the flash memory controller via the I/O control circuit and the specific communication interface, with actually controlling the voltage generator making the memory cell array generate failure errors. The access operation is a program operation, a cache program operation, or an erase operation; the debug information is associated with a true program failure, a true cache program failure, or a true erase failure, and the debug circuit controls the memory cell array generating a program failure error, a cache program failure error, or an erase failure error.

According to the embodiments, a method of a flash memory device to be used in a storage device and coupled to a flash memory controller of the storage device through a specific communication interface is disclosed. The method comprises: providing an input/output (I/O) control circuit, coupled to the flash memory controller through the specific communication interface; providing a command register, coupled to the I/O control circuit, for buffering command information sent from the flash memory controller and transmitted through the I/O control circuit; providing an address register, coupled to the I/O control circuit, for buffering address information sent from the flash memory controller and transmitted through the I/O control circuit; providing a memory cell array, at least having a first plane and a second plane which is different from the first plane; providing at least one address decoder, coupled to the memory cell array; providing a status register, coupled to the I/O control circuit; providing a voltage generator, coupled to the memory cell array; using a debug circuit to automatically generate debug information of an access operation in response to a reception of an error injection command signal sent from the flash memory controller with actually controlling the voltage generator making the memory cell array generate failure errors; and, transmitting the generated debug information into the status register and controlling the status register transmitting the debug information from the flash memory device to the flash memory controller via the I/O control circuit and the specific communication interface. The access operation is a program operation, a cache program operation, or an erase operation; the debug information is associated with a true program failure, a true cache program failure, or a true erase failure, and the debug circuit controls the memory cell array generating a program failure error, a cache program failure error, or an erase failure error.

According to the embodiments, a flash memory controller to be used in a storage device and coupled to a flash memory device of the storage device through a specific communication interface is disclosed. The method comprises an input/output (I/O) circuit and a processor. The I/O circuit is coupled to the flash memory device through the specific communication interface, and is used for sending commands and data between the flash memory device and a processor. The processor is coupled to the I/O circuit, and is used for controlling the I/O circuit sending an error injection command signal to the flash memory device through the specific communication interface to make the debug circuit automatically generate debug information of an access operation in response to a reception of the error injection command signal sent from the flash memory controller, for transmitting the generated debug information from the flash memory device to the flash memory controller via the I/O control circuit and the specific communication interface, with actually controlling a memory cell array of flash memory device generating failure errors. The access operation is a program operation, a cache program operation, or an erase operation; the debug information is associated with a true program failure, a true cache program failure, or a true erase failure, and the debug circuit controls the memory cell array generating a program failure error, a cache program failure error, or an erase failure error.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
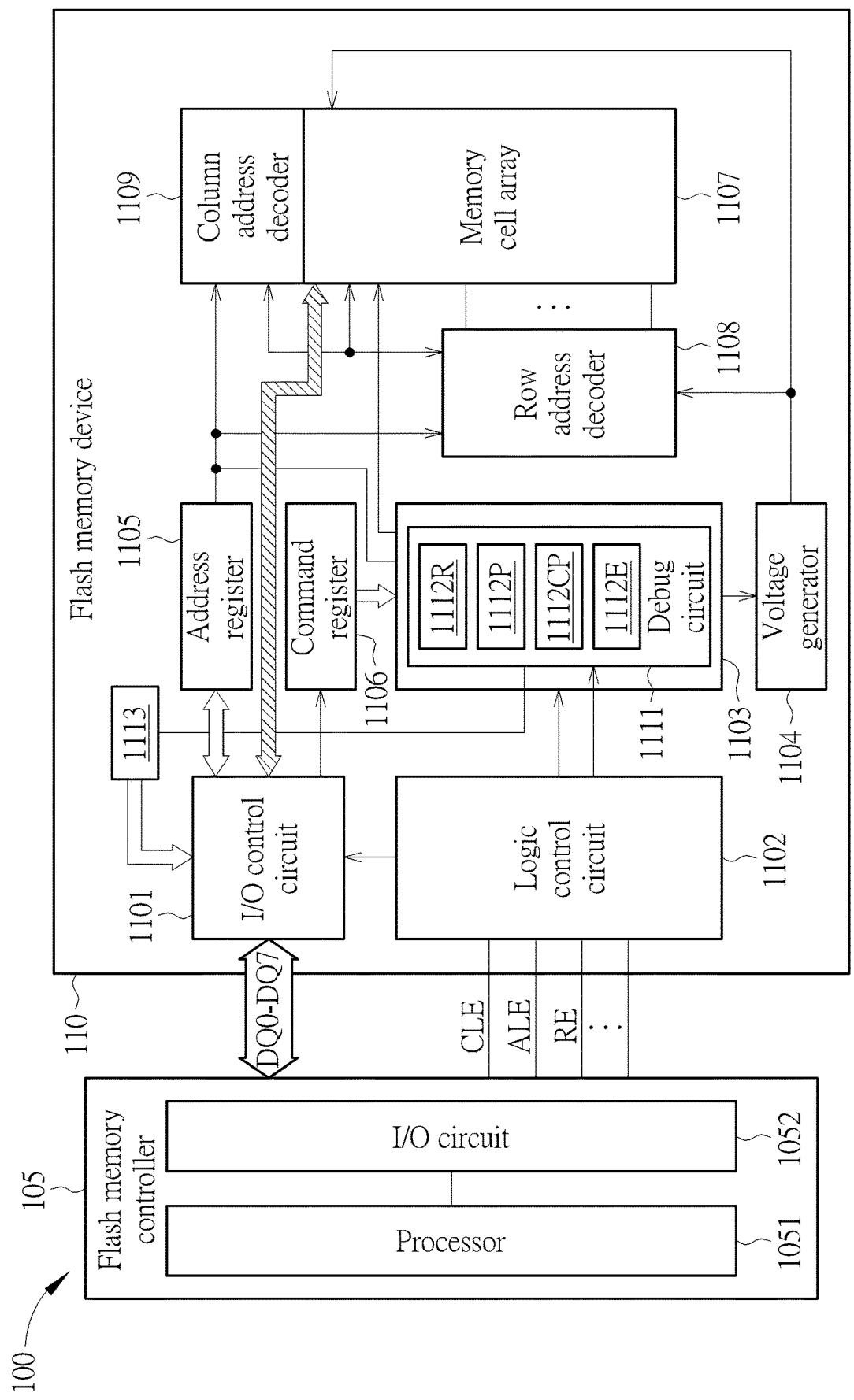
FIG. 1 is a diagram of an example of a storage device comprising a flash memory controller and a flash memory device such as an NAND-type flash memory device including multiples chips/dies according to an embodiment of the invention.

FIG. 1 is a diagram of an example of a storage device 100 comprising a flash memory controller 105 and a flash memory device 110 such as an NAND-type flash memory device including multiples chips/dies according to an embodiment of the invention. The flash memory controller 105 at least comprises a processor 1051 and an input/output (I/O) circuit 1052. The processor 1051 is coupled to the I/O circuit 1052 and is arranged to control the I/O circuit 1052 sending access (e.g. read, write/program, cache program, or erase) command signals/sequences through a specific communication interface to the flash memory device 110 to control and access the flash memory device 110.

The flash memory device 110 comprises an I/O control circuit 1101, a logic control circuit 1102, a control circuit 1103 having a debug circuit 1111, a voltage generator 1104 such as a high-voltage generator (but not limited), an address register 1105, a command register 1106, a memory cell array 1107, a row address decoder 1108, a column address decoder 1109, and a status register 1113.

The flash memory controller 105 is coupled to the flash memory device 110 through the specific communication interface and controls or accesses the flash memory device 110 by sending one or more commands into the flash memory device 110. The specific communication interface for example comprises at least signal ports/pins such as data pins DQ0-DQ7 or other data pins (not shown in FIG. 1), and logic control pins such as CLE (Command Latch Enable), ALE (Address Latch Enable), RE (Read Enable), and other logical control pins. The data pins DQ0-DQ7 are coupled to the I/O control circuit 1101, and the logic control pins are coupled to the logic control circuit 1102. The memory cell array 1107 has two or more planes (not shown in FIG. 1).

In practice, when the flash memory controller 105 sends command data of a command signal, the flash memory controller 105 controls the signal of the pin ALE at a low level and controls the signal of the pin CLE at a high level so that the flash memory device 110 can know that the data received via the pins DQ0-DQ7 is command data and then can store the received command data into the command register 1106 through the I/O control circuit 1101. Similarly, when the flash memory controller 105 sends address data, the flash memory controller 105 controls the signal of the pin ALE at the high level and controls the signal of the pin CLE at the low level so that the flash memory device 110 can know that the data received via the pins DQ0-DQ7 is address data and then can store the received address data into the address register 1105 through the I/O control circuit 1101. The operations associated with the pin RE and/or other pins (not shown in FIG. 1) are not detailed for brevity.

In addition, the control circuit 1103 (or debug circuit 1111) can control the voltage generator 1104 to output different voltage levels to the row address decoder 1108 and the column address decoder 1109 so that the row address decoder 1108 and the column address decoder 1109 can control the memory cell array 1107 performing a program operation, a cache program operation, or an erase operation according to the voltage levels, the received address(es) buffered by the address register 1105, and the received command(s) buffered by the command register 1106.

The debug circuit 1111 is coupled to the logic control circuit 1102 and the status register 1113. The debug circuit 1111 can be arranged to control the voltage generator 1104 in a control scheme and does not control the voltage generator 1104 in a different control scheme. For example, the debug circuit 1111 can control the voltage generator 1104 outputting or adjusting voltage levels and/or voltage time periods provided for the memory cell array 1107. In one embodiment, if the debug circuit 1111 does not control the voltage generator 1104, the voltage generator 1104 may be optional and is not controlled by the debug circuit 1111; this is not intended to be a limitation. In addition, the debug circuit 1111 can generate, write, and store corresponding debug information (which indicates a simulated fail/failure result or a true fail/failure result) into the status register 1113, wherein the debug information may comprise debug information of a program failure, debug information of a cache program failure, and/or debug information of an erase failure. The debug information can be sent to the flash memory controller 15 for debugging and checking, and thus can be regarded as debug information. The debug circuit 1111 for example (but not limited) comprises a random module/circuit 1112R and at least one counter such as three counters 1112P, 1112CP, and 1112E which are respectively associated with the program operation, the cache program operation, and the erase operation.

The invention aims at providing a technical solution capable of simplifying the flow (or procedure) of an error handle debug operation executed by a firmware component running on the flash memory controller 105 that is externally coupled to the flash memory device 110 such as an NAND-type flash memory including one or more chips or dies (but not limited). Ideally, in a normal operation mode, when the flash memory controller 105 sends a program/erase (or cache program) command signal/sequence to the flash memory device 110, the flash memory device 110 can correctly perform the program/erase (or cache program) operation; there is a remote possibility or chance that errors of the program/erase (or cache program) failure will occur actually.

To test whether the flash memory controller 105 (and/or the flash memory device 110) can handle this situation, the flash memory controller 105 can configure or enable the error handle debug operation/mode) of the flash memory device 110, and the flash memory device 110 in such debug mode can automatically generate/write debug information of a program/erase (or cache program) failure in response to a specific control command signal of the flash memory controller and/or in a pseudo-random manner. The flash memory device 110 then can transmit the generated debug information back to the flash memory controller 105 so that the firmware component running on the flash memory controller 105 can perform the error handle debug operation to handle a simulated failure error or a true failure error based on the debug information. For example, the flash memory controller's 105 error handling may mean the response and recovery procedures from true or simulated error condition(s). The generated debug information can indicate whether the failure error is a simulated failure error or a true failure error. The invention provides various embodiments/examples which are described in the following paragraphs.

Figure 2:
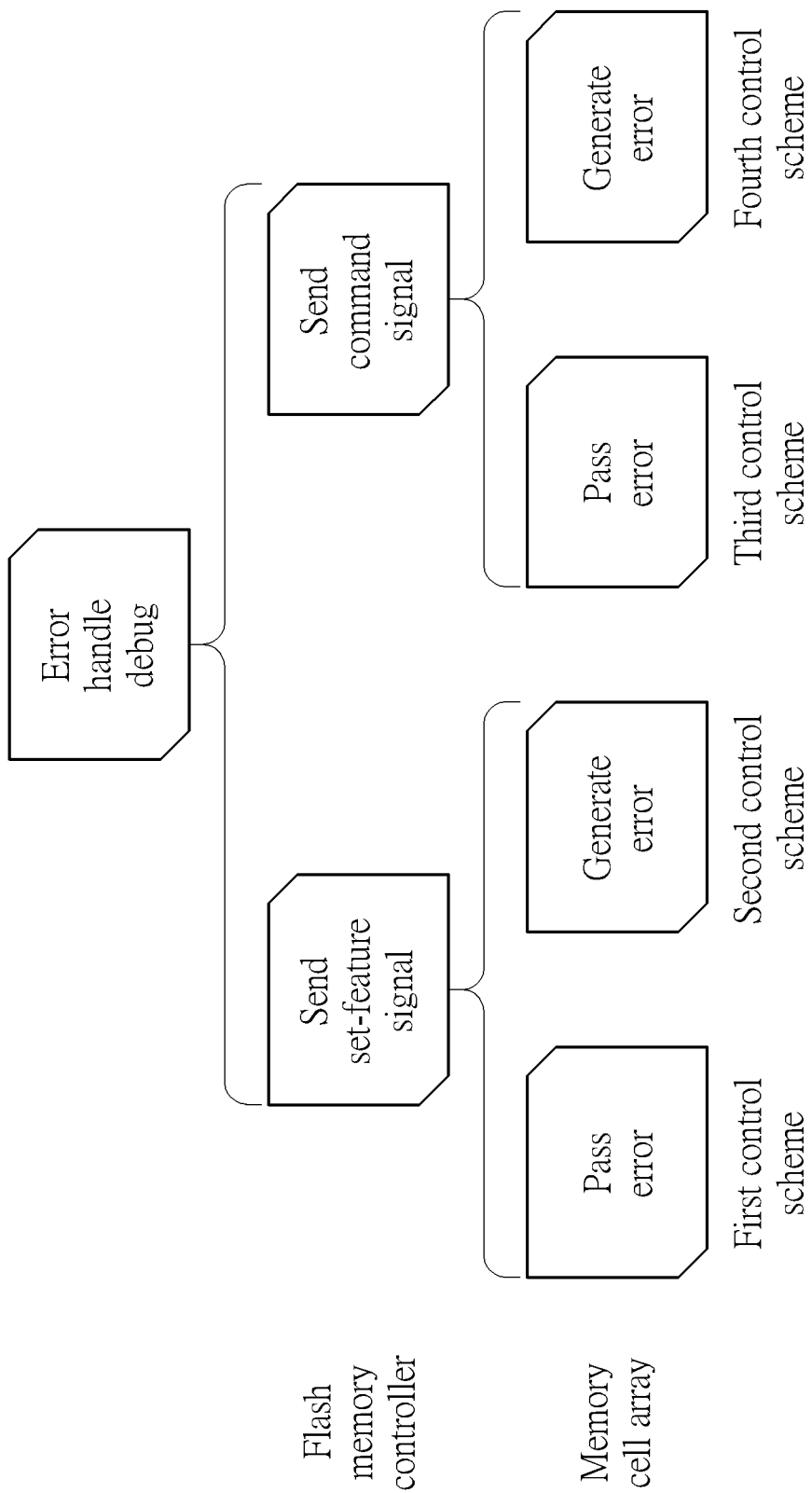
FIG. 2 is a diagram of four different control schemes of the error handle debug operation/mode according to different embodiments of the invention.

FIG. 2 is a diagram of four different control schemes of the error handle debug operation/mode according to different embodiments of the invention.

In a first control scheme, the flash memory controller 105 can send a specific set-feature signal (e.g. a debug injection set-feature signal) to enable/disable or configure the error handle debug operation of the flash memory device 110, and the flash memory device 110 may pseudo-randomly generate and write the debug information into its status register 1113 and then transmit the debug information from its status register 1113 to the flash memory controller 105 through the I/O control circuit 1101 without actually controlling its memory cell array 1107 generating errors of an access failure. That is, the generated debug information indicates a simulated failure error, and the term "debug injection set-feature signal" means using a set-feature signal format to merely generate the debug information without actually generating the failure error. For example, when receiving an access command signal (e.g. program command, cache program command, or erase command) sent from the flash memory controller 105, the flash memory device 110 generates the debug information of an access failure of the corresponding access operation without generating errors of the access failure. That is, the flash memory device 110 merely generates the debug information and still correctly performs the corresponding access operation upon the memory cell array 1107 without generating errors into the memory cell array 1107. The debug information is transmitted and provided for the flash memory controller 105 to check whether the flash memory controller 105 can correctly handle this situation. In the first control scheme, the debug circuit 1111 is arranged to determine whether to enter an error handle debug mode in response to a reception of the access command signal and automatically generate the debug information of the access operation when it is in the error handle debug mode, and the flash memory controller 105 does not know whether and when debug information of an access command signal will be transmitted from the flash memory device 110 to the flash memory controller 105. Thus, the error handle debug operation can be executed more comprehensively to check whether the flash memory controller 105 can handle a bug.

In a second control scheme, the flash memory controller 105 can send a specific set-feature signal (e.g. an error injection set-feature signal, different from the debug injection set-feature signal) to enable/disable or configure the error handle debug operation of the flash memory device 110, and the flash memory device 110 may pseudo-randomly generate and write the debug information into its status register 1113 and then transmit the debug information from its status register 1113 to the flash memory controller 105 through the I/O control circuit 1101 with actually controlling its memory cell array 1107 generating errors of an access failure. That is, the generated debug information indicates a true failure error, and the term "error injection set-feature signal" means using a set-feature signal format to generate the debug information and also actually generate the failure error. For example, when receiving an access command signal (e.g. program command, cache program command, or erase command) sent from the flash memory controller 105, the flash memory device 110 generates the debug information of an access failure of the corresponding access operation and also generates errors of the access failure. That is, the flash memory device 110 generates the debug information and fails to perform the corresponding access operation upon the memory cell array 1107. The debug information is transmitted and provided for the flash memory controller 105 to check whether the flash memory controller 105 can correctly handle this situation. In the second control scheme, the debug circuit 1111 is arranged to determine whether to enter an error handle debug mode in response to a reception of the access command signal and automatically generate the debug information of the access operation when it is in the error handle debug mode, and the flash memory controller 105 does not know whether and when debug information of an access command signal will be transmitted from the flash memory device 110 to the flash memory controller 105. Thus, the error handle debug operation can be executed more comprehensively to check whether the flash memory controller 105 can handle a bug.

In a third control scheme, the flash memory controller 105 can send a specific command signal (e.g. a debug injection command signal) to enable and trigger the error handle debug operation of the flash memory device 110, and the flash memory device 110 may instantly generate and write the debug information into its status register 1113 and then transmit the debug information from its status register 1113 to the flash memory controller 105 through the I/O control circuit 1101 without actually controlling its memory cell array 1107 generating an access failure error, i.e. merely generating the debug information of an access failure and not generating program/erase (or cache program) failure errors of the memory cell array 1107. That is, the generated debug information indicates a simulated failure error, and the term "debug injection command" means using a command signal format to merely generate the debug information without actually generating the failure error. In the third control scheme, when the flash memory controller 105 determine to enter the debug mode for an access command signal, the flash memory device 110 instantly reports the debug information of the access command signal back to the flash memory controller 105 without generating an access failure error (e.g. program failure error, cache program failure, or erase failure error).

In a fourth control scheme, the flash memory controller 105 can send a specific command signal (e.g. an error injection command signal different from the debug injection command signal) to enable and trigger the error handle debug operation of the flash memory device 110, and the flash memory device 110 may instantly generate and write the debug information into its status register 1113 and then transmit the debug information from its status register 1113 to the flash memory controller 105 through the I/O control circuit 1101 with actually controlling its memory cell array 1107 generating errors, i.e. generating the debug information and also generating program/erase (or cache program) failure errors into the memory cell array 1107. That is, the generated debug information indicates a true failure error, and the term "error injection command" means using a command signal format to generate the debug information and also actually generate the failure error. In the fourth control scheme, when the flash memory controller 105 determine to enter the debug mode for an access command signal, the flash memory device 110 instantly reports the debug information of the access command signal back to the flash memory controller 105 and also generates an access failure error (e.g. program failure error, cache program failure, or erase failure error).

The embodiments of the above-mentioned four control schemes are described in the following paragraphs.

First Control Scheme:

The flash memory controller 105 can send one or more specific set-feature signals to enable/disable or configure the parameter(s) of error handle debug operation of the flash memory device 110 so that the flash memory device 110 can automatically generate and write the debug information (debug information associated of simulated program failure, simulated erase failure, and/or simulated cache program failure) into its status register 1113 in a pseudo-random manner and transmit the debug information back to the flash memory controller 105 without actually controlling its memory cell array 1107 generating errors, i.e. passing the generation of errors. In the embodiments, the flash memory controller 105 controls the flash memory device 110 automatically writing and recording debug information at its status register 1113. Through the bidirectional communications/operations (including that the flash memory controller 105 controls the flash memory device 110 automatically generating debug information and that the flash memory device 110 transmits the generated debug information back to the flash memory controller 105), the test result of the error handle debug operation performed by the flash memory controller 105 can be correct and accurate.

In one embodiment, the generated debug information of the simulated program failure, simulated cache program failure, and/or simulated erase failure may comprise plane/block/page address debug information and/or the information: indicating the simulated failure(s). In practice, for example, when determining to generate debug information, the flash memory device 110 (or debug circuit 1111) is arranged to determine which plane(s) the debug information is associated with. If a plane is decided to be associated with the debug information for an access command signal, then such plane can be regarded as a fail plane for the simulated program failure, simulated cache program failure, and/or simulated erase failure of the access command signal. This is similar for blocks/pages, and corresponding operations are not detailed for brevity.

In the first control scheme, in practice, the setting of the operation of the debug circuit 1111 can be configured by the flash memory controller 105 to send a specific debug injection set-feature signal from the flash memory controller 105 to the flash memory device 110 to enable or disable the operation of the debug circuit 1111.

Figure 3:
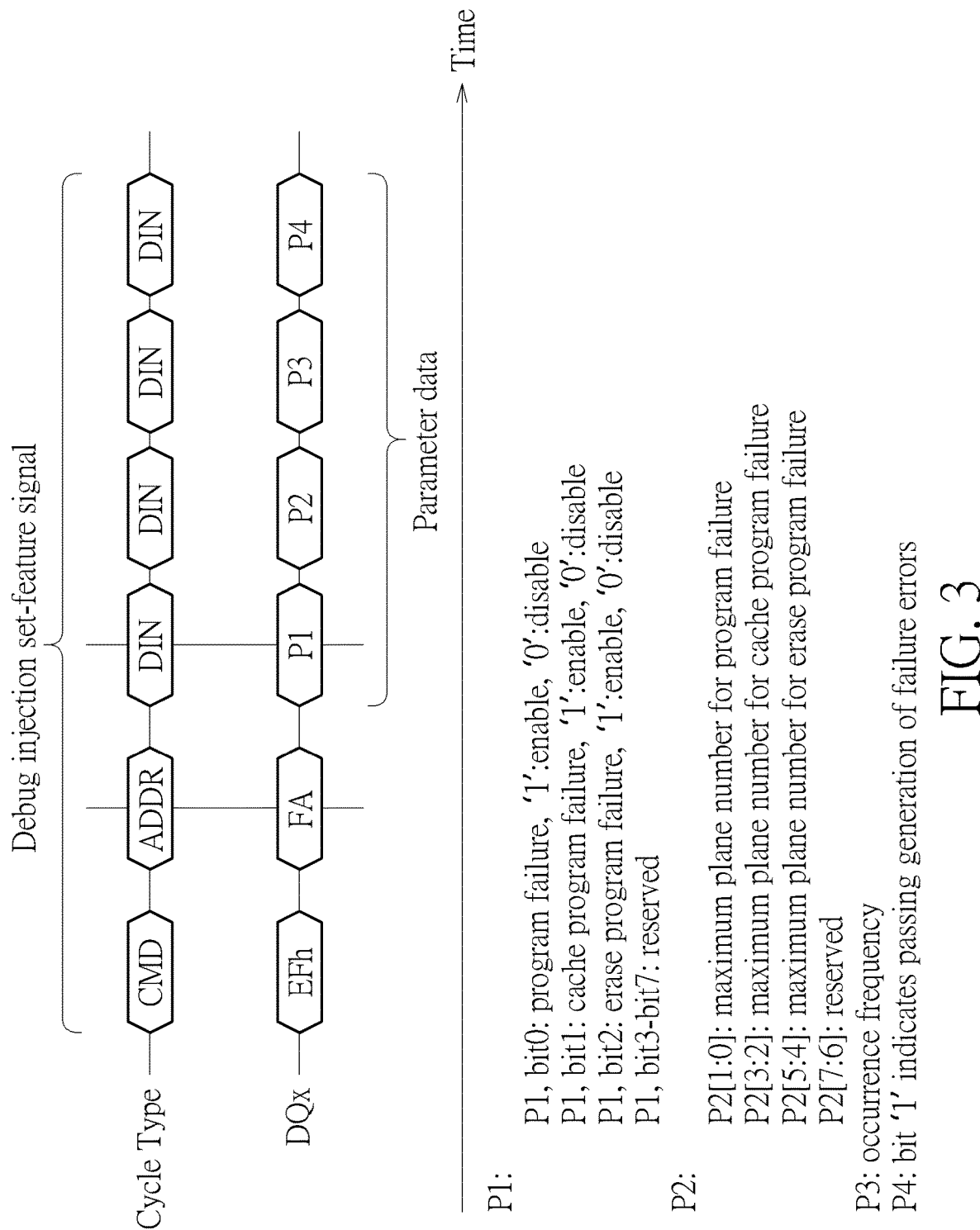
FIG. 3 is a diagram showing an example format of a specific debug injection set-feature signal sent from the flash memory controller to the flash memory device to configure/set the feature information or parameter(s) of the operation of the debug circuit of the flash memory device according to an embodiment of the invention.

FIG. 3 is a diagram showing an example format of a specific debug injection set-feature signal sent from the flash memory controller 105 to the flash memory device 110 to configure/set the feature information or parameter(s) of the operation of the debug circuit 1111 of the flash memory device 110 according to an embodiment of the invention. As shown in FIG. 3, when the flash memory controller 105 or flash memory device 110 is supplied with power (or it is powered on), the processor 1051 of the flash memory controller 105 can control the I/O circuit 1052 sending a specific debug injection set-feature signal to the flash memory device 110 to enable or disable the operation of the debug circuit 1111 or configure one or more parameters of such operation.

For example, the specific debug injection set-feature signal may comprise a set-feature command (cycle type indicated by CMD) such as EFh (but not limited) and corresponding control information which follows the set-feature command EFh. The control information for example comprises a feature information FA (cycle type indicated by ADDR and corresponds to a debug injection) and/or one or more parameter data P1, P2, P3, and P4 (cycle type indicated by DIN). One parameter data can be implemented by using one or more bits or using one byte or more bytes if the number of totally used parameter data is less than four. The total data length of all parameter data can be configured to meet or match the requirements specified in the standards of flash memory controller/device products; for example (but not limited), the total data length of all the parameter data can be configured as four bytes. The number of parameter data is not intended to be a limitation.

For setting the features or parameters of the operation of the debug circuit 1111, the content of feature information (or feature address) FA is determined to be associated with the operation of the debug circuit 1111, and thus the flash memory device 110 can know that the following parameter data P1, P2, P3, and P4 are used for setting/configuring the operation of the debug circuit 1111 when receiving such feature information FA. The examples of its corresponding information and descriptions of the feature information FA can be indicated by the following table:

| Feature | Description |
|---|---|
| 00h | Reserved |
| 01h | Timing Mode |
| 02h | NV-DDR2/NV-DDR3/NV-LPDDR4 Configuration |
| 03h-0Fh | Reserved |
| 10h | I/O Drive Strength |
| 11h-1Fh | Reserved |
| 20h | DCC, Read, Write Tx Training |
| 21h | Write Training RX |
| 22h | Channel ODT configuration for NV-LPDDR4 |
| 23h | Internal VrefQ value |
| 24h-2Fh | Reserved |
| 30h | External Vpp Configuration |
| 31h-4Fh | Reserved |
| 50h | Reserved |
| 51h-57h | Reserved |
| 58h | Volume Configuration |
| 59h-5Fh | Reserved |
| 60h | Reserved |
| 61h | Reserved |
| 62h-7Fh | Vendor specific |
| 80h-FFh | Vendor specific |

In one embodiment, the feature information FA for example can be a feature address such as value of 0x24 (i.e. 24h) wherein 'h' means hexadecimal. In other embodiment, the reserved examples, e.g. 00h, 03h-0Fh, 11h-1Fh, 24h-2Fh, or other reserved addresses, can be used to implement the feature information FA. This is not meant to be a limitation.

The parameter data P1 of the debug injection set-feature signal is used to indicate which kind of debug information injected/generated by the debug circuit 1111. For example (but not limited), the determined debug information may be debug information of a simulated program failure, simulated cache program failure, or simulated erase failure. The parameter data P1 for example comprises eight bits in which a first bit bit0 is used to indicate injecting the debug information of simulated program failure, a second bit bit1 is used to indicate injecting the debug information of simulated cache program failure, a third bit bit2 is used to indicate injecting the debug information of simulated erase failure, and the other bits bit3-bit7 may be reserved.

For example (but not limited), the operation of injecting the debug information of simulated program failure is enabled if the first bit bit0 is equal to a first logic bit '1' and it is disabled if the first bit bit0 is equal to a second logic bit '0'. The operation of injecting the debug information of simulated cache program failure is enabled if the second bit bit1 is equal to '1' and it is disabled if the second bit bit1 is equal to '0'. Similarly, the operation of injecting the debug information of simulated erase failure is enabled if the third bit bit2 is equal to '1' and it is disabled if the third bit bit2 is equal to '0'; this is not meant to be a limitation.

For example (but not limited), the flash memory controller 105 can send a debug injection set-feature signal, which carries the parameter data P1 in which the first bit bit0 is configured as '1' and the bits bit1 and bit2 are configured as '0', to enable the operation of injecting the debug information of simulated program failure, disable the operation of injecting the debug information of simulated cache program failure, and disable the operation of injecting the debug information of simulated erase failure. Thus, after receiving such content information of the parameter data P1, the debug circuit 1111 can know that the flash memory controller 105 would like to enable the operation of injecting the debug information of simulated program failure.

The parameter data P2 of the debug injection set-feature signal is used to indicate the maximum fail plane numbers respectively limiting the simulated program failure, simulated cache program failure, and simulated erase failure. For example (but not limited), the parameter data P2 may comprise eight bits in which a first portion of bits such as P2[1:0] (i.e. a first bit and a second bit of parameter data P2) is used to indicate the maximum fail plane number limiting the simulated program failure, a second portion of bits such as P2[3:2] (i.e. a third bit and a fourth bit of parameter data P2) is used to indicate the maximum fail plane number limiting the simulated cache program failure, a third portion of bits such as P2[5:4] (i.e. a fifth bit and a sixth bit of parameter data P2) is used to indicate the maximum fail plane number limiting the simulated erase failure, and the other bits P2[7:6] may be reserved. This is not indented to be a limitation.

The parameter data P3 of the debug injection set-feature signal is used to indicate an occurrence frequency that is configured by the flash memory controller 105. For example, the occurrence frequency is used to indicate at least one threshold value corresponding at least one accumulated command number such as an accumulated program command number, an accumulated cache program command number, and an accumulated erase command number. When an accumulated command number becomes higher than a corresponding threshold, the debug circuit 1111 instantly generates corresponding debug information. The different occurrence frequencies are respectively associated with different threshold values. A higher threshold value indicates a lower occurrence frequency that the debug circuit 1111 generates debug information. The flash memory controller 105 can update the threshold value(s) by sending corresponding content information of the parameter data P3 of the debug injection set-feature signal.

Further, in one embodiment, the debug circuit 1111 in a default setting may comprise built-in threshold values such as a built-in program command threshold, a built-in cache program command threshold, and a built-in erase command threshold. Alternatively, in one embodiment, the flash memory controller 105 may use and transmit an debug injection set-feature signal comprising the set-feature command EFh, the feature address FA, and parameter data such as four bytes, wherein the specific address FA indicates that the specific set-feature signal is used to re-configure the program command threshold, the cache program command threshold, or the erase command threshold when the specific address is equal to the feature address 0x14, 0x26, or 0x27, respectively. The four bytes of the parameter data are used to indicate the actual value of the threshold to be configured.

The parameter data P4 of the debug injection set-feature signal is used by the flash memory controller 105 to indicate whether to control the debug circuit 1111 actually generating failure error(s) into the memory cell array 1107 of the flash memory device 110. For example (but not limited), when one bit of the parameter data P4 is set as a first logic bit '1', the operation of the debug circuit 1111 is configured to not actually generate the errors into the memory cell array 1107, i.e. only generating the debug information and passing the generation of the failure error(s). When the parameter data P4 is set as a second logic bit '0', the operation of the debug circuit 1111 is configured to actually generate the errors into the memory cell array 1107, i.e. actually generating the failure errors into the memory cell array 1107. It should be noted that in the first control scheme the above-mentioned bit of the parameter data P4 is configured as '1' by the flash memory controller 105 so as to indicate and control the debug circuit 1111 not generating the errors into the memory cell array 1107.

For example (but not limited), in one embodiment of the first control scheme, the flash memory controller 105 may send a debug injection set-feature signal in which the bit bit0 of parameter data P1 is configured as '1' and other bits of parameter data P1 are '0', and the debug circuit 1111 of the flash memory device 110 can know that the operation of injecting the debug information of simulated program failure is enabled after receiving such debug injection set-feature signal. Also, based on the first portion of bits P2[1:0] in the received debug injection set-feature signal, the debug circuit 1111 can obtain and know the maximum fail plane number corresponding to the debug information of simulated program failure. Further, based on the value of parameter data P3 in the received debug injection set-feature signal, the debug circuit 1111 can obtain and know the threshold value to be compared to the accumulated program command number. Further, based on the bit '1' of parameter data P4 in the received debug injection set-feature signal, the debug circuit 1111 can obtain and know that the debug mode or operation is executed based on the first control scheme.

Thus, after the operation of the debug circuit 1111 has been configured by the received debug injection set-feature signal, the debug circuit 1111 of the flash memory device 110 is arranged to randomly (or in a pseudo-random manner) generate debug information. The first portion of bits P2[1:0] is used to indicate that the maximum fail plane number for the plane(s) of the memory array of the flash memory device 110 is limited to the value of bits P2[1:0]. That is, the actually determined fail plane number should be equal to or smaller than the maximum fail plane number. For instance, if the value of bits P2[1:0] (i.e. maximum fail plane number) is configured as four, then this indicates that the number of planes actually associated with the debug information of simulated program failure generated by the debug circuit 1111 may be one, two, three, or four.

Alternatively, if the value of bits P2[1:0] is configured as one, then this indicates that the number of plane actually associated with the debug information of simulated program failure generated by the debug circuit 1111 is only equal to one. It should be noted that in this example a plane associated with simulated program failure is randomly determined by the debug circuit 1111 from the all the planes of the memory cell array 1107, i.e. there is a possibility that any one plane will be the simulated program failure plane.

If the debug circuit 1111 determines that a plane having a serial number PLN2 is the simulated program failure plane, then the debug circuit 1111 is arranged to determine that a fail plane index is equal to the serial number PLN2 and then write the information (i.e. the fail plane index) into the status of the status register 1113 so that the flash memory device 110 can report the debug information of the status register 1113 back to the flash memory controller 105 in response to a polling operation performed by the flash memory controller 105. That is, the fail plane index is a portion of the debug information reported back to the flash memory controller 105.

This is also similar to the operation of injecting the debug information of simulated cache program failure and the operation of injecting the debug information of simulated erase failure. The second portion of bits P2[3:2] is used to indicate that the maximum fail plane number for the plane(s) of the memory array of the flash memory device 110 is limited to the value of bits P2[3:2] for the operation of injecting the debug information of simulated cache program failure. The third portion of bits P2[5:4] is used to indicate that the maximum fail plane number for the plane(s) of the memory array of the flash memory device 110 is limited to the value of bits P2[5:4] for the operation of injecting the debug information of simulated erase failure. Other operations are not detailed for brevity.

In the embodiments of the first control scheme, the debug circuit 1111 may generate the debug information after the number of received command signals (i.e. command number) is accumulated to be enough, and the above-mentioned counters are employed. For example, a default counting value of the first counter 1112P is zero. When a program command signal of the program operation is received by the flash memory device 110, the accumulated program command number is incremented by one and the counting value of the first counter 1112P increments by one. When the counting value of the first counter 1112P is higher than a first threshold TH1 which is set by the parameter data P3, the flash memory device 110 (or debug circuit 1111) is arranged to automatically and instantly generate debug information of the simulated program failure, and then the counting value of the first counter 1112P is reset as zero. The generated debug information of the simulated program failure is then transmitted and stored into the status register 1113, which then transmits the generated debug information to the I/O control circuit 1101 so that the generated debug information can be transmitted and reported back to the flash memory controller 105 through the data pins DQ0-DQ7 or other data pins of the specific communication interface.

Similarly, a default counting value of the second counter 1112CP is zero. When a cache program command signal of the cache program operation is received by the flash memory device 110, the accumulated cache program command number is incremented by one and the counting value of the second counter 1112CP increments by one. When the counting value of the second counter 1112CP is higher than a second threshold TH2 which is set by the parameter data P3, the flash memory device 110 (or debug circuit 1111) is arranged to automatically and instantly generate debug information of the simulated cache program failure, and then the counting value of the second counter 1112CP is reset as zero. The generated debug information of the simulated cache program failure is then transmitted and stored into the status register 1113, which then transmits the generated debug information to the I/O control circuit 1101 so that the generated debug information can be transmitted and reported back to the flash memory controller 105 through the data pins DQ0-DQ7 or other data pins of the specific communication interface.

Similarly, a default counting value of the third counter 1112E is zero. When an erase command signal of the erase operation is received by the flash memory device 110, the accumulated erase command number is incremented by one and the counting value of the third counter 1112E increments by one. When the counting value of the third counter 1112E is higher than a third threshold TH3 which is set by the parameter data P3, the flash memory device 110 (or debug circuit 1111) is arranged to automatically and instantly generate debug information of the simulated erase failure, and then the counting value of the third counter 1112E is reset as zero. The generated debug information of the simulated erase failure is then transmitted and stored into the status register 1113, which then transmits the generated debug information to the I/O control circuit 1101 so that the generated debug information can be transmitted and reported back to the flash memory controller 105 through the data pins DQ0-DQ7 or other data pins of the specific communication interface.

It should be noted that the value(s) of the above-mentioned threshold(s) can be default value(s) or can be adjusted and changed dynamically by the flash memory controller 105.

Further, in one embodiment of the first control scheme, the debug circuit 1111 further comprises one maximum fail plane number, and the maximum fail plane number is used to indicate a maximum number of fail planes for the debug information of the simulated program failure, simulated cache program failure, and/or simulated erase failure in a default setting or configured by the flash memory controller 105. The number of maximum fail plane number(s) may be configured by the flash memory controller 105; this is not intended to be a limitation.

Further, the random module/circuit 1112R is used to generate at least one first pseudo-random number for the debug information of the simulated program failure, simulated cache program failure, and/or simulated erase failure. The debug circuit 1111 determines the total actual number of fail plane(s) according to the generated pseudo-random number and the maximum fail plane number determined in the parameter data P2. In practice, the debug circuit 1111 performs the modulo operation to generate a remainder number as the total actual number of fail plane(s) by dividing the generated pseudo-random number with the maximum fail plane number, i.e. the pseudo-random number modulo the maximum fail plane number. For example (but not limited), if the generated first pseudo-random number is equal to 2 and the maximum fail plane number is equal to 4, then the debug circuit 1111 performs the modulo operation to generate a remainder number 2 as the total actual number of fail plane(s) by diving 2 with 4.

In addition, the random module/circuit 1112R further generates least one second pseudo-random number. After determining the total actual number of fail plane(s), the debug circuit 1111 determines which plane(s) is/are fail plane(s) according to the generated at least one second pseudo-random number and the total number of all planes of the flash memory device 110. For example, in practice, for determining which plane is a fail plane, the debug circuit 1111 performs the modulo operation to generate a remainder number as a serial number of a specific plane to be configured as a fail plane by dividing the generated at least one second pseudo-random number with the total number of all planes, i.e. the second pseudo-random number modulo the total number of all planes. The debug circuit 1111 repeats generating the second pseudo-random number and repeats the above operation until the number of the determined fail plane(s) is equal to the total number of fail plane(s).

For example (but not limited), to inject the debug information of simulated program failure (debug information of simulated cache program failure or debug information of simulated erase failure), if the total number of all planes of the flash memory device 110 is 4, their serial numbers are PLN0, PLN1, PLN2, and PLN3, and the total actual number of determined fail planes is 2 (based on the first pseudo-random number mentioned above), then the debug circuit 1111 may generate two second pseudo-random numbers such as 8 and 3 and it is arranged to respectively divide 8 and 3 with the total number of all planes (i.e. 4) to generate and obtain the remainder numbers such as 0 and 3; that is, in this example, the debug circuit 1111 determines that the two planes having the serial numbers PLN0 and PLN3 are fail planes. After determining the actual fail plane(s), the debug circuit 1111 then transmits and writes the debug information to the status register 1113, wherein the debug information comprises the information of which plane(s) is/are fail plane(s). Then, the flash memory controller 105 (or processor 151) can perform a polling operation upon the flash memory device 110 to make the flash memory device 110 return or transmit the debug information of which plane(s) is/are fail plane(s) back to the flash memory controller 105 via the communication interface.

Further, in one embodiment, for example (but not limited), the flash memory controller 105 may send a polling signal comprising a specific command such as 70h into the flash memory device 110, and then the flash memory device 110 may reports or transmits data of 0xE1 to indicate that there exist(s) fail plane(s). Then, the flash memory controller 105 may send another polling signal comprising a specific command such as 78h and information of a plane index such as PLN0 into the flash memory device 110, and then the flash memory device 110 may reports or transmits data of 0xE0 to indicate that the plane having the plane index (or serial number) PLN0 is not a fail plane wherein the tailing bit '0' indicates no debug information. Similarly, the flash memory controller 105 may send another polling signal comprising the specific command such as 78h and information of a plane index such as PLN1 into the flash memory device 110, and then the flash memory device 110 may reports or transmits data of 0xE0 to indicate that the plane having the plane index (or serial number) PLN1 is not a fail plane. Then, the flash memory controller 105 may send another polling signal comprising the specific command such as 78h and information of a plane index such as PLN2 into the flash memory device 110, and then the flash memory device 110 may report or transmit data of 0xE1 to indicate that the plane having the plane index (or serial number) PLN2 is a simulated program failure plane wherein the tailing bit '1' indicates the simulated program failure. Then, the flash memory controller 105 may send another polling signal comprising the specific command such as 78h and information of a plane index such as PLN3 into the flash memory device 110, and then the flash memory device 110 may reports or transmits data of 0xE0 to indicate that the plane having the plane index (or serial number) PLN3 is not a fail plane. This example is not meant to be a limitation. By doing so, the firmware running on the flash memory controller 105 can exactly know that only the plane having the plane index PLN2 is a simulated program failure plane and the other planes are not fail planes.

Similarly, for example (but not limited), the flash memory controller 105 may send a polling signal comprising the specific command such as 70h into the flash memory device 110, and then the flash memory device 110 may reports or transmits data of 0xE1 to indicate that there exist(s) fail plane(s). Then, the flash memory controller 105 may send another polling signal comprising a specific command such as 78h and information of a plane index such as PLN0 into the flash memory device 110, and then the flash memory device 110 may reports or transmits data of 0xE2 to indicate that the plane having the plane index (or serial number) PLN0 is a simulated cache program failure plane wherein the tailing bit '2' indicates the simulated cache program failure. Similarly, the flash memory controller 105 may send another polling signal comprising the specific command such as 78h and information of a plane index such as PLN1 into the flash memory device 110, and then the flash memory device 110 may reports or transmits data of 0xE0 to indicate that the plane having the plane index (or serial number) PLN1 is not a fail plane. Then, the flash memory controller 105 may send another polling signal comprising the specific command such as 78h and information of a plane index such as PLN2 into the flash memory device 110, and then the flash memory device 110 may reports or transmits data of 0xE0 to indicate that the plane having the plane index (or serial number) PLN2 is not a fail plane. Then, the flash memory controller 105 may send another polling signal comprising the specific command such as 78h and information of a plane index such as PLN3 into the flash memory device 110, and then the flash memory device 110 reports or transmits data of 0xE0 to indicate that the plane having the plane index (or serial number) PLN3 is not a fail plane. This example is not meant to be a limitation. By doing so, the firmware running on the flash memory controller 105 can exactly know that only the plane having the plane index PLN0 is a simulated cache program failure plane and the other planes are not fail planes.

Similarly, for example (but not limited), the flash memory controller 105 may send a polling signal comprising the specific command such as 70h into the flash memory device 110, and then the flash memory device 110 may reports or transmits data of 0xE1 to indicate that there exist(s) fail plane(s). Then, the flash memory controller 105 may send another polling signal comprising a specific command such as 78h and information of a plane index such as PLN0 into the flash memory device 110, and then the flash memory device 110 may reports or transmits data of 0xE0 to indicate that the plane having the plane index (or serial number) PLN0 is not a fail plane. The flash memory controller 105 may send another polling signal comprising the specific command such as 78h and information of a plane index such as PLN1 into the flash memory device 110, and then the flash memory device 110 may report or transmit data of 0xE3 to indicate that the plane having the plane index (or serial number) PLN1 is a simulated erase failure plane wherein the tailing bit '3' indicates the simulated erase failure. Then, the flash memory controller 105 may send another polling signal comprising the specific command such as 78h and information of a plane index such as PLN2 into the flash memory device 110, and then the flash memory device 110 may reports or transmits data of 0xE0 to indicate that the plane having the plane index (or serial number) PLN2 is not a fail plane. Then, the flash memory controller 105 may send another polling signal comprising the specific command such as 78h and information of a plane index such as PLN3 into the flash memory device 110, and then the flash memory device 110 reports or transmits data of 0xE0 to indicate that the plane having the plane index (or serial number) PLN3 is not a fail plane. This example is not meant to be a limitation. By doing so, the firmware running on the flash memory controller 105 can exactly know that only the plane having the plane index PLN1 is a simulated erase failure plane and the other planes are not fail planes.

It should be noted that the debug circuit 1111 only needs to control a fail bit information recorded in the status register 1113 as the logic bit '1' (but not limited) to indicate that a specific plane corresponding to the fail bit information is a fail plane, and the flash memory controller 105 can perform the above-mentioned polling operation to obtain the fail bit information. It is not required to further implement hardware circuit(s) for the flash memory device 110.

Figure 4:
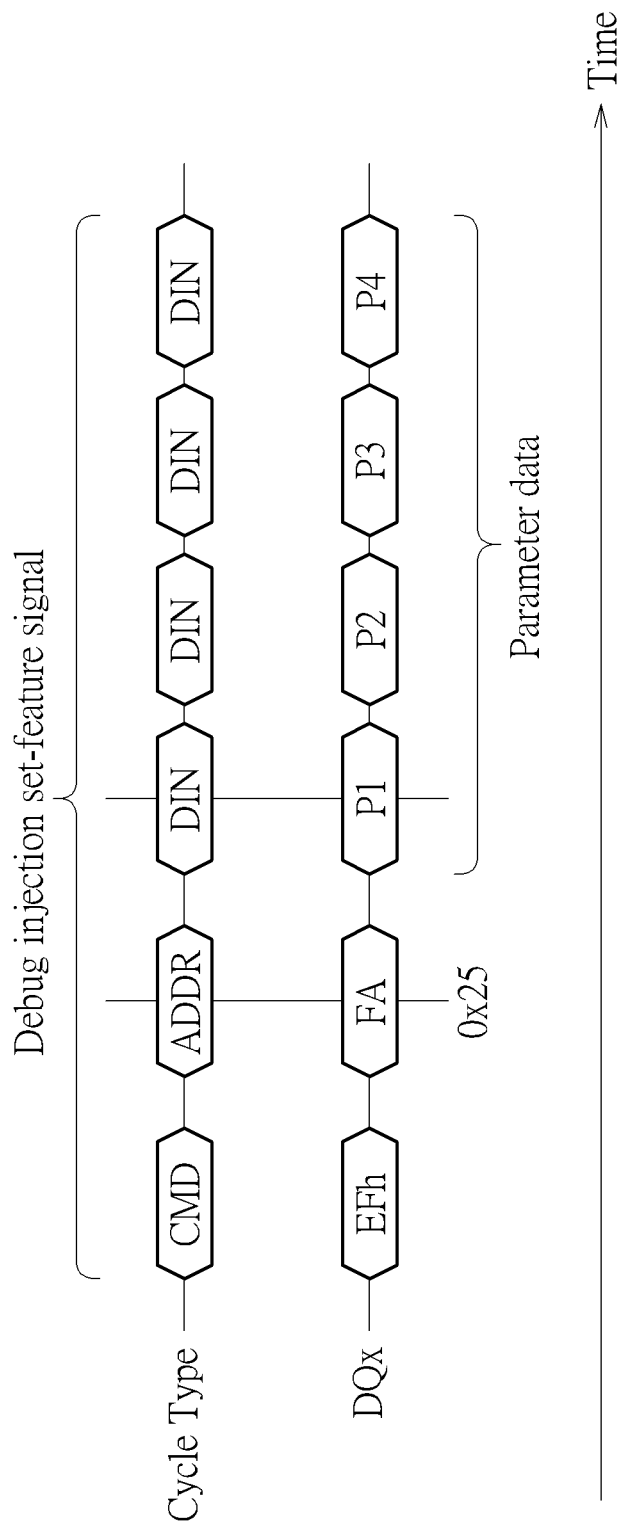
FIG. 4 is a diagram showing an example format of the flash memory controller sending a specific debug injection set-feature signal to the flash memory device to configure/set the maximum debug information number(s) according to an embodiment of the invention.

In one embodiment of the first control scheme, the flash memory controller 105 can use and send another specific debug injection set-feature signal to the flash memory device 110 to configure a maximum debug information number (i.e. the maximum number of debug information) that can be generated by the debug circuit 1111 of the flash memory device 110 for the program operation, cache program operation, and/or erase operation. FIG. 4 is a diagram showing an example format of the flash memory controller 105 sending a specific debug injection set-feature signal to the flash memory device 110 to configure/set the maximum debug information number(s) according to an embodiment of the invention. As shown in FIG. 4, when the flash memory controller 105 or flash memory device 110 is supplied with power (or it is powered on), the processor 1051 of the flash memory controller 105 can control the I/O circuit 1052 sending the specific debug injection set-feature signal to the flash memory device 110 to configure/set the maximum debug information number(s).

For example, the specific debug injection set-feature signal may comprise a set-feature command (cycle type indicated by CMD) such as EFh (but not limited) and corresponding control information which follows the set-feature command EFh. The control information for example comprises a feature information FA (cycle type indicated by ADDR) such as a different feature address 0x25 (i.e. 25h) and/or one or more parameter data P1, P2, P3, and P4 (cycle type indicated by DIN), wherein 'h' means hexadecimal. One parameter data can be implemented by using one or more bits or using one byte or more bytes if the number of totally used parameter data is less than four. The total data length of all parameter data can be configured to meet or match the requirements specified in the standards of flash memory controller/device products; for example (but not limited), the total data length of all the parameter data can be configured as four bytes. The number of parameter data is not intended to be a limitation.

In FIG. 4, the parameter data P1 and P2 of the debug injection set-feature signal is used to indicate a value of a maximum erase debug information count (i.e. a maximum number of debug information of the simulated erase failure), and the parameter data P3 and P4 of the debug injection set-feature signal is used to indicate a value of a maximum program (or cache program) debug information count (i.e. a maximum number of debug information of the simulated program (or cache program) failure). For example, when the accumulated command number of the generated debug information of the simulated erase failure becomes equal to the value of the maximum erase debug information count indicated by the parameter data P1 and P2, the debug circuit 1111 stops generating the erase debug information. Similarly, when the accumulated command number of the generated debug information of the simulated program (and/or cache program) failure becomes equal to the value of the maximum program debug information count indicated by the parameter data P3 and P4, the debug circuit 1111 stops generating the debug information of the simulated program (and/or cache program) failure.

Further, it should be noted that, in one embodiment, the flash memory controller 105 can send a specific get-feature signal to the flash memory device 110 to ask the flash memory device 110 returning or transmitting back the above-mentioned configured information, so as to check whether the information is correct.

Alternatively, in one embodiment, the flash memory controller 105 can send a specific get-feature signal to the flash memory device 110 to ask the flash memory device 110 returning or transmitting back the accumulated command number of debug information generated by the debug circuit 1111 during a specific time period, for the simulated program failure, simulated cache program failure, and/or simulated erase failure. Further, the flash memory controller 105 can use and send a get-feature signal to the flash memory device 110 to control the flash memory device 110 stopping generating debug information.

The get-feature signal may sequentially comprise a get-feature command and a get-feature address such as a corresponding feature address. The corresponding operations are not detailed for brevity.

The operations of injecting debug information of simulated cache program failure and debug information of simulated erase failure in the first control scheme are similar to those of injecting the debug information of simulated program failure mentioned above. The descriptions are not detailed for brevity.

Second Control Scheme:

In the embodiments of the second control scheme, in addition to generating the debug information in the above-mentioned operations of the first control scheme, the flash memory controller 105 can control the flash memory device 110 automatically making the memory cell array 1107 actually generate program (cache program or erase) failure errors. The flash memory controller 105 can send one or more specific set-feature signals (e.g. an error injection set-feature signal) to enable/disable or configure the error handle debug operation of the flash memory device 110 so that the flash memory device 110 can automatically generate and write the debug information (debug information associated of true program failure, true erase failure, and/or true cache program failure) into its status register 1113 in a pseudo-random manner and transmit the debug information back to the flash memory controller 105 with actually controlling its memory cell array 1107 generating errors, i.e. not passing the generation of errors.

Through the bidirectional communications/operations (including that the flash memory controller 105 controls the flash memory device 110 automatically generating debug information and that the flash memory device 110 transmits the generated debug information back to the flash memory controller 105) and actually controlling its memory cell array 1107 generating errors, the test result of the error handle debug operation performed by the flash memory controller 105 can be more correct and accurate.

In the second control scheme different from the first control scheme, in practice, the setting of the operation of the debug circuit 1111 can be also configured by the flash memory controller 105 to send a specific error injection set-feature signal from the flash memory controller 105 to the flash memory device 110 to enable or disable the operation of the debug circuit 1111.

Figure 5:
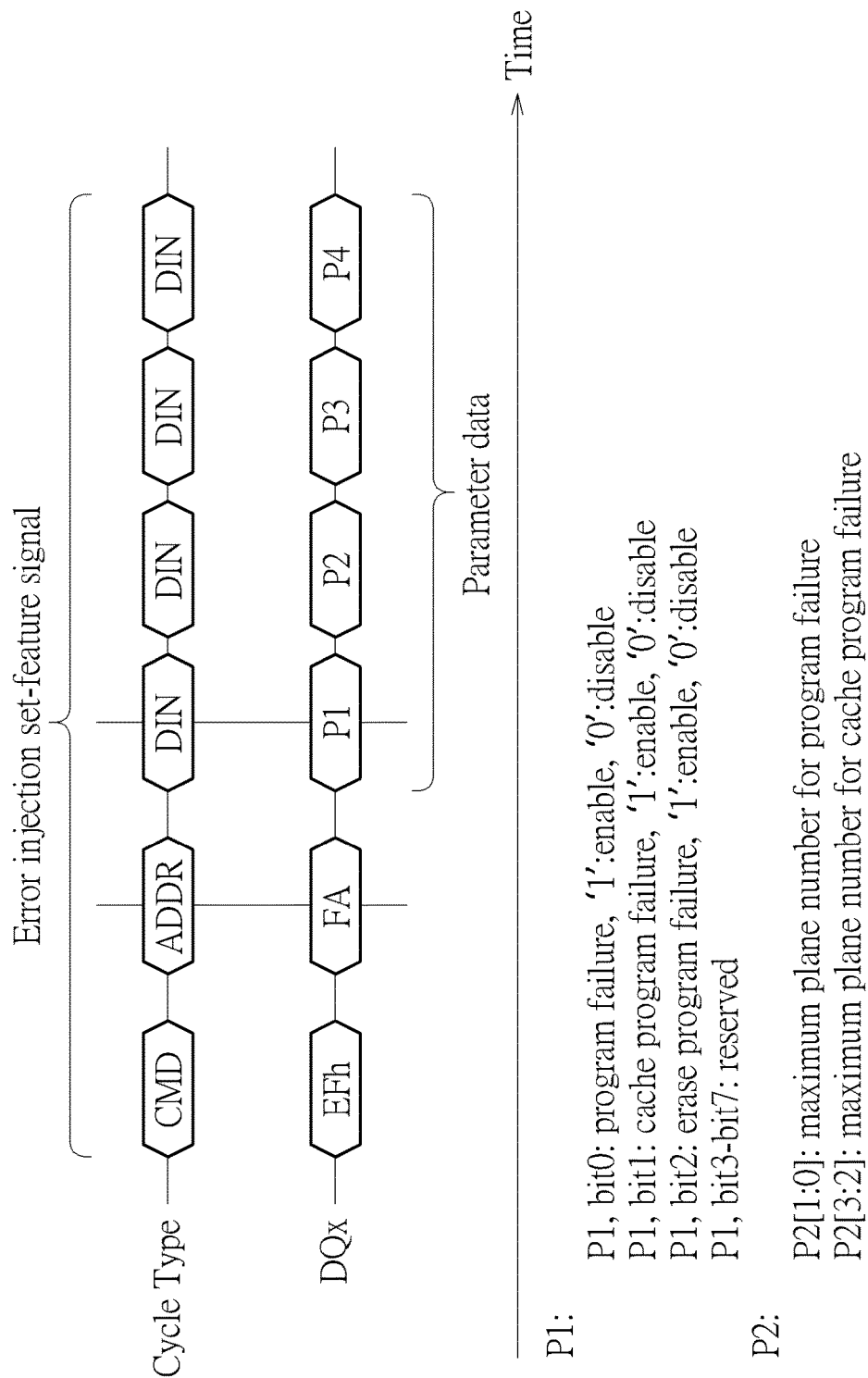
FIG. 5 is a diagram showing an example format of a specific debug injection set-feature signal sent from the flash memory controller to the flash memory device to configure/set the feature information or parameter(s) of the operation of the debug circuit of the flash memory device according to an embodiment of the invention.

FIG. 5 is a diagram showing an example format of a specific error injection set-feature signal sent from the flash memory controller 105 to the flash memory device 110 to configure/set the feature information or parameter(s) of the operation of the debug circuit 1111 of the flash memory device 110 according to an embodiment of the invention. As shown in FIG. 5, when the flash memory controller 105 or flash memory device 110 is supplied with power (or it is powered on), the processor 1051 of the flash memory controller 105 can control the I/O circuit 1052 sending a specific error injection set-feature signal to the flash memory device 110 to enable or disable the operation of the debug circuit 1111 or configure one or more parameters of such operation.

For example, the specific error injection set-feature signal may comprise a set-feature command (cycle type indicated by CMD) such as EFh (but not limited) and corresponding control information which follows the set-feature command EFh. The control information for example comprises a feature information FA (cycle type indicated by ADDR) and/or one or more parameter data P1, P2, P3, and P4 (cycle type indicated by DIN). One parameter data can be implemented by using one or more bits or using one byte or more bytes if the number of totally used parameter data is less than four. The total data length of all parameter data can be configured to meet or match the requirements specified in the standards of flash memory controller/device products; for example (but not limited), the total data length of all the parameter data can be configured as four bytes. The number of parameter data is not intended to be a limitation.

The functions and descriptions of parameter data P1, P2, and P3 of the error injection set-feature signal in FIG. 5 are similar to those of the parameter data P1, P2, and P3 of the debug injection set-feature signal in FIG. 3, and are not detailed for brevity. The parameter data P4 of the error injection set-feature signal in FIG. 5 is used by the flash memory controller 105 to indicate whether to control the debug circuit 1111 actually generating failure error(s) into the memory cell array 1107 of the flash memory device 110. For example (but not limited), when one bit of the parameter data P4 is set as a first logic bit '1', the operation of the debug circuit 1111 is configured to not actually generate the errors into the memory cell array 1107, i.e. only generating the debug information and passing the generation of the failure error(s). When the parameter data P4 is set as a second logic bit '0', the operation of the debug circuit 1111 is configured to actually generate the errors into the memory cell array 1107, i.e. actually generating the failure errors into the memory cell array 1107. It should be noted that, in the second control scheme, the above-mentioned bit of the parameter data P4 is configured as '0' by the flash memory controller 105 so as to indicate and control the debug circuit 1111 actually generating the failure errors into the memory cell array 1107.

To control the memory cell array 1107 generating failure errors actually, the debug circuit 1111 can control the voltage generator 1104 outputting different voltage levels (provided for the control gate(s) of the memory cell array 1107) and/or different voltage time periods. For example (but not limited), in a normal program operation, the voltage generator 1104 is arranged to generate and apply different voltage levels upon a control gate until a threshold voltage of a cell unit in a specific page/block/plane becomes equal to an expected voltage level. To actually generate a true program failure error (a true cache program error or a true erase failure error) occurring in the cell unit, the debug circuit 1111 may control the voltage generator 1104 adjusting the voltage levels upon the control gate to make the threshold voltage of the cell unit be not enough or be too much high. Alternatively, the debug circuit 1111 may control the voltage generator 1104 stopping the output of the voltage levels. Alternatively, the debug circuit 1111 may control the voltage generator 1104 adjusting the voltage time period to make the operation of controlling the voltage level upon the control gate becomes timeout.

Figure 6:
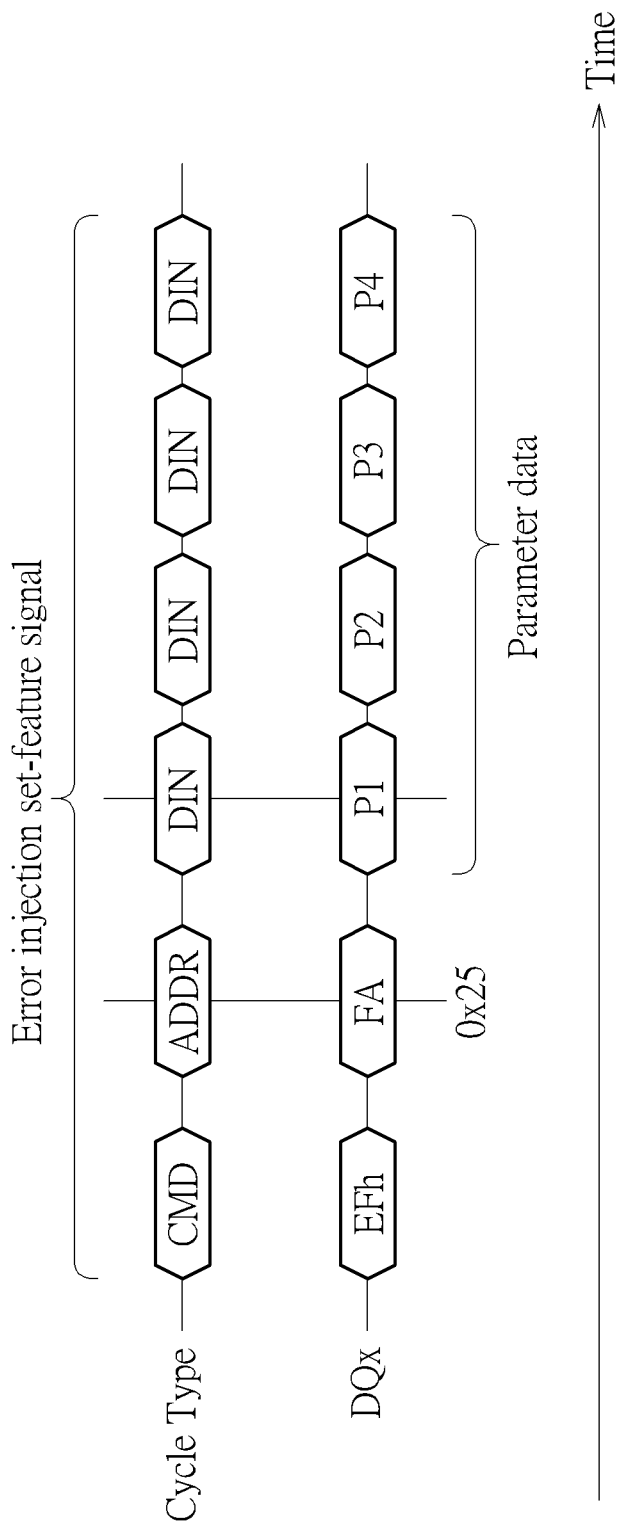
FIG. 6 is a diagram showing an example format of the flash memory controller sending a specific debug injection set-feature signal to the flash memory device to configure/set the maximum fail block number(s) according to an embodiment of the invention.

In the second control scheme, to actually generate fail blocks (i.e. blocks having program, cache program, or erase failure errors), the flash memory controller 105 can use and send another specific error injection set-feature signal to the flash memory device 110 to configure a maximum fail block number that can be generated in the memory cell array 1107, controlled by the debug circuit 1111 of the flash memory device 110, for the true program failure, true cache program failure, and/or true erase failure. FIG. 6 is a diagram showing an example format of the flash memory controller 105 sending a specific error injection set-feature signal to the flash memory device 110 to configure/set the maximum fail block number(s) according to an embodiment of the invention. As shown in FIG. 6, when the flash memory controller 105 or flash memory device 110 is supplied with power (or it is powered on), the processor 1051 of the flash memory controller 105 can control the I/O circuit 1052 sending the specific error injection set-feature signal to the flash memory device 110 to configure/set the maximum fail block number(s).

For example, the specific error injection set-feature signal may comprise a set-feature command (cycle type indicated by CMD) such as EFh (but not limited) and corresponding control information which follows the set-feature command EFh. The control information for example comprises a feature information FA (cycle type indicated by ADDR) such as a different feature address 0x25 (i.e. 25h; but not limited) and/or one or more parameter data P1, P2, P3, and P4 (cycle type indicated by DIN), wherein 'h' means hexadecimal. One parameter data can be implemented by using one or more bits or using one byte or more bytes if the number of totally used parameter data is less than four. The total data length of all parameter data can be configured to meet or match the requirements specified in the standards of flash memory controller/device products; for example (but not limited), the total data length of all the parameter data can be configured as four bytes. The number of parameter data is not intended to be a limitation.

In FIG. 6, the parameter data P1 and P2 of the error injection set-feature signal is used to indicate a value of a maximum erase failure block count (i.e. a maximum erase failure block number), and the parameter data P3 and P4 of the error injection set-feature signal is used to indicate a value of a maximum program (or cache program) fail block count (i.e. a maximum program (or cache program) fail block number). For example, when the accumulated number of the generated erase failure blocks becomes equal to the value of the maximum erase failure block count indicated by the parameter data P1 and P2, the debug circuit 1111 stops generating an erase failure block. Similarly, when the accumulated number of the generated program (and/or cache program) fail blocks becomes equal to the value of the maximum program failure block count indicated by the parameter data P3 and P4, the debug circuit 1111 stops generating a program (and/or cache program) fail block.

Figure 7:
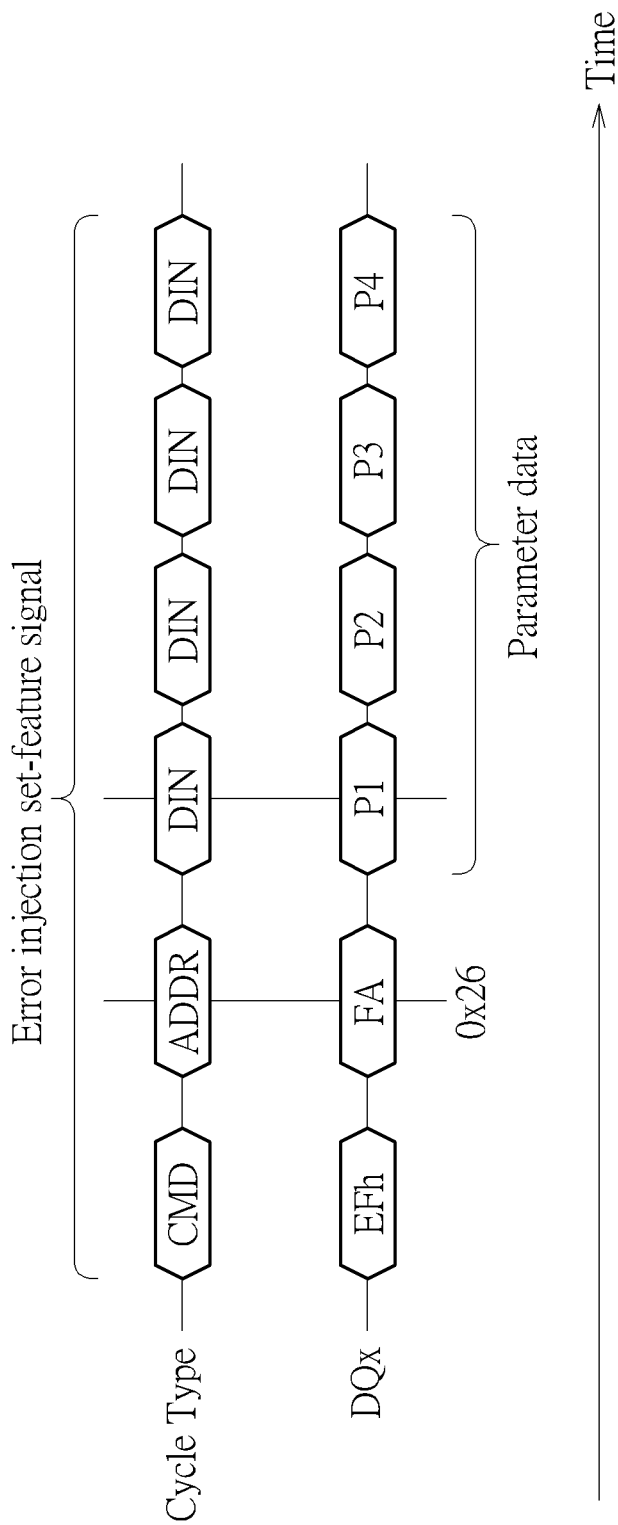
FIG. 7 is a diagram showing an example format of the flash memory controller sending a specific debug injection set-feature signal to the flash memory device to configure/set the block address region according to an embodiment of the invention.

Further, in one embodiment of the second control scheme, to actually generate fail blocks (i.e. blocks having program, cache program, or erase failure errors), the flash memory controller 105 can use and send another specific error injection set-feature signal to the flash memory device 110 to configure a block address region that errors can be generated by the flash memory device 110 in the memory cell array 1107, for the true program failure, true cache program failure, and/or true erase failure. FIG. 7 is a diagram showing an example format of the flash memory controller 105 sending a specific error injection set-feature signal to the flash memory device 110 to configure/set the block address region according to an embodiment of the invention. As shown in FIG. 7, when the flash memory controller 105 or flash memory device 110 is supplied with power (or it is powered on), the processor 1051 of the flash memory controller 105 can control the I/O circuit 1052 sending the specific error injection set-feature signal to the flash memory device 110 to configure/set the block address region.

For example, the specific error injection set-feature signal may comprise a set-feature command (cycle type indicated by CMD) such as EFh (but not limited) and corresponding control information which follows the set-feature command EFh. The control information for example comprises a feature information FA (cycle type indicated by ADDR) such as a different feature address 0x26 (i.e. 26h) and/or one or more parameter data P1, P2, P3, and P4 (cycle type indicated by DIN), wherein 'h' means hexadecimal. One parameter data can be implemented by using one or more bits or using one byte or more bytes if the number of totally used parameter data is less than four. The total data length of all parameter data can be configured to meet or match the requirements specified in the standards of flash memory controller/device products; for example (but not limited), the total data length of all the parameter data can be configured as four bytes. The number of parameter data is not intended to be a limitation.

In FIG. 7, the parameter data P1 and P2 of the error injection set-feature signal is used to indicate a value of a start block address of the block address region, and the parameter data P3 and P4 of the error injection set-feature signal is used to indicate a value of an end block address of the block address region. After receiving the specific set-feature signal, the flash memory device 110 can generate debug information associated with one or more blocks within the block address region if it is needed to generate debug information. Similarly, the flash memory controller 105 can use and send a specific get-feature signal to the flash memory device 110 to ask/control the flash memory device 110 reporting or transmitting the values of start block address and the end block address back to the flash memory controller 105 so as to check whether the values are correct. This modification example can be applied into an example of the flash memory device 110's storage space being divided into a group of static blocks (for SLC mode) and a group of dynamic blocks (e.g. for TLC mode), and the flash memory controller 105 may be arranged to test the static blocks rather than the dynamic blocks. In this example, the flash memory controller 105 can send the specific get-feature signal to the flash memory device 110 to specific a specific block address region/range of the static blocks. The block can be a single block at a single die/chip or can be a super block formed by different blocks respectively at different dies/chips.

Figure 8:
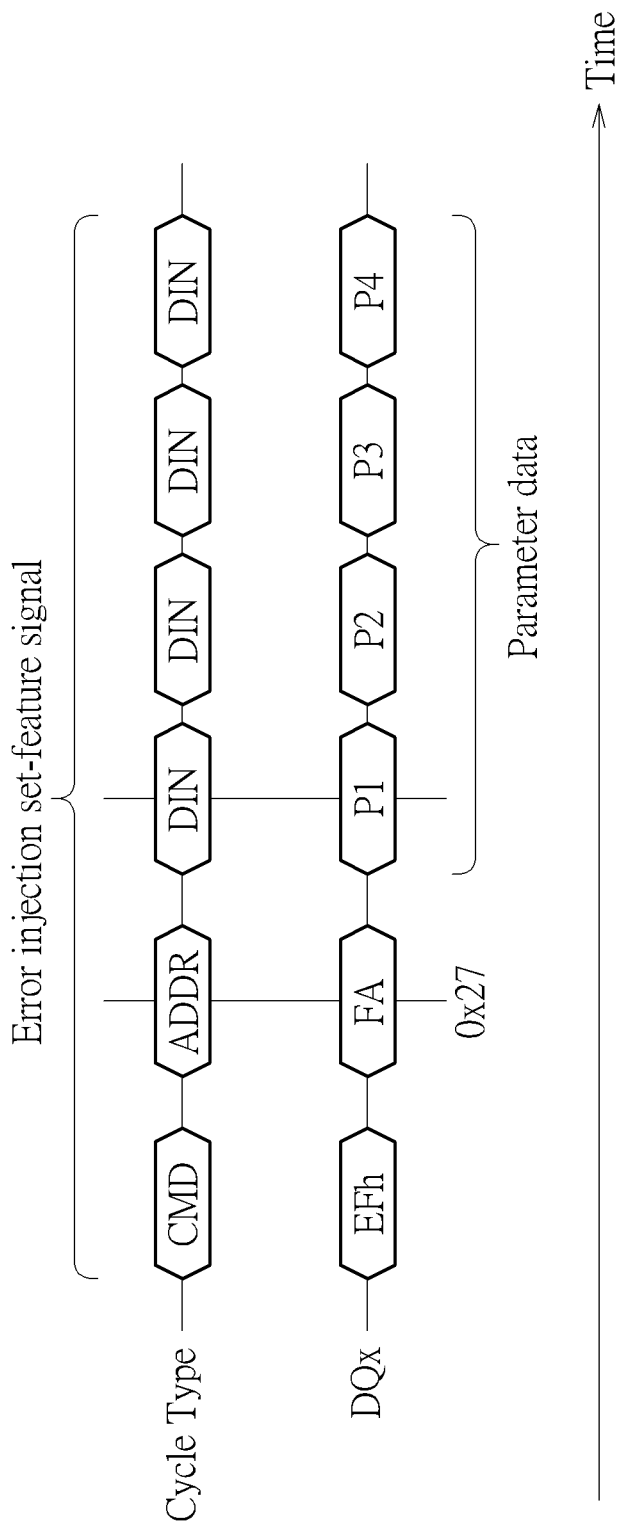
FIG. 8 is a diagram showing an example format of the flash memory controller sending a specific debug injection set-feature signal to the flash memory device to configure/set the page address region according to an embodiment of the invention.

Further, in one embodiment of the second control scheme, to actually generate fail pages (i.e. pages having program, cache program, or erase failure errors), the flash memory controller 105 can use and send another specific error injection set-feature signal to the flash memory device 110 to configure a page address region that errors can be generated by the flash memory device 110 in the memory cell array 1107, for the true program failure, true cache program failure, and/or true erase failure. FIG. 8 is a diagram showing an example format of the flash memory controller 105 sending a specific error injection set-feature signal to the flash memory device 110 to configure/set the page address region according to an embodiment of the invention. As shown in FIG. 8, when the flash memory controller 105 or flash memory device 110 is supplied with power (or it is powered on), the processor 1051 of the flash memory controller 105 can control the I/O circuit 1052 sending the specific error injection set-feature signal to the flash memory device 110 to configure/set the page address region.

For example, the specific error injection set-feature signal may comprise a set-feature command (cycle type indicated by CMD) such as EFh (but not limited) and corresponding control information which follows the set-feature command EFh. The control information for example comprises a feature information FA (cycle type indicated by ADDR) such as a different feature address 0x26 (i.e. 26h) and/or one or more parameter data P1, P2, P3, and P4 (cycle type indicated by DIN), wherein 'h' means hexadecimal. One parameter data can be implemented by using one or more bits or using one byte or more bytes if the number of totally used parameter data is less than four. The total data length of all parameter data can be configured to meet or match the requirements specified in the standards of flash memory controller/device products; for example (but not limited), the total data length of all the parameter data can be configured as four bytes. The number of parameter data is not intended to be a limitation.

In FIG. 8, the parameter data P1 and P2 of the error injection set-feature signal is used to indicate a value of a start page address of the page address region, and the parameter data P3 and P4 of the error injection set-feature signal is used to indicate a value of an end page address of the page address region. Similarly, the flash memory controller 105 can use and send a specific get-feature signal to the flash memory device 110 to ask/control the flash memory device 110 reporting or transmitting the values of start page address and the end page address back to the flash memory controller 105 so as to check whether the values are correct. The page can be a single page at a single die/chip or can be a super page formed by different pages at different dies/chips.

Further, it should be noted that, in one embodiment, the flash memory controller 105 can send a specific get-feature signal to the flash memory device 110 to ask the flash memory device 110 returning or transmitting back the above-mentioned configured information, so as to check whether the information is correct.

Alternatively, in one embodiment, the flash memory controller 105 can send a specific get-feature signal to the flash memory device 110 to ask the flash memory device 110 returning or transmitting back the currently accumulated number of fail blocks/pages generated by the debug circuit 1111 during a specific time period, for the true program failure, true cache program failure, and/or true erase failure. Further, the flash memory controller 105 can use and send a get-feature signal to the flash memory device 110 to control the flash memory device 110 stopping generating fail block(s)/pages.

The get-feature signal may sequentially comprise a get-feature command and a get-feature address such as a corresponding feature address. The corresponding operations are not detailed for brevity.

It should be noted that, in one embodiment, the number of fail blocks/pages is equal to one when a fail block/page of a specific plane is generated, and in other embodiments the number of fail blocks/pages is equal to more than two if the debug information is generated for a block (or a super block) at more than two different planes.

The operations of injecting cache program debug information with error(s) and erase debug information with error(s) in the second control scheme are similar to those of injecting the program debug information with error(s) mentioned above. The descriptions are not detailed for brevity.

Figure 9:
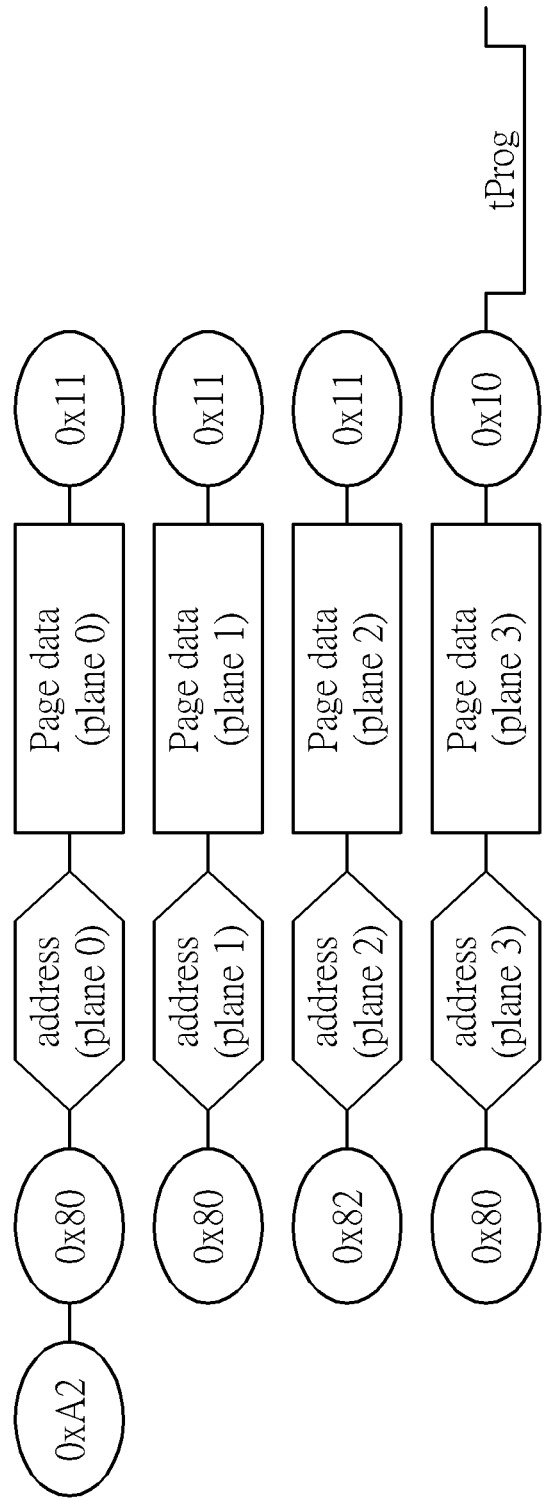
FIG. 9 is a diagram of an example of the flash memory controller sending at least one write/program command signal such as four write/program command sub-sequences to the flash memory device according to an embodiment of the invention.

Third Control Scheme:

In other embodiments, the flash memory controller 105 can send a specific debug injection command signal to control the flash memory device 110 performing a corresponding processing operation (e.g. program, cache program or erase) of the specific command signal and also instantly generating and reporting debug information of the corresponding processing operation back to the flash memory controller 105, without actually controlling its memory cell array 1107 generating failure errors. FIG. 9 is a diagram of an example of the flash memory controller 105 sending at least one write/program command signal such as four write/program command sub-sequences to the flash memory device 110 according to an embodiment of the invention. In FIG. 9, the flash memory controller 105 sequentially sends four write command sub-sequences to the flash memory device 110. A first write command sub-sequence sequentially comprises an SLC programming instruction/command such as 0xA2 (but not limited), a page program command such as the command 0x80 (but not limited), five-cycle address information (row and column addresses) of the 0-th plane, page data to be programed of the 0-th plane, and an intermediate confirm command such as a change write command such as the command 0x11 (but not limited), wherein the address information of the 0-th plane comprises page address, block address, die/chip address, and plane address.

A second write command sub-sequence sequentially comprises a page program command 0x80, five-cycle address information of the 1-th plane, page data to be programed of the 1-th plane, and a change write command 0x11, wherein the address information of the 1-th plane comprises page address, block address, die/chip address, and plane address. A third write command sub-sequence sequentially comprises a specific debug injection program command such as 0x82 (which has a function of a page program command 0x80 and can replace a page program command 0x80), address information of the 2-th plane, page data to be programed of the 2-th plane, and a change write command 0x11, wherein the address information of the 2-th plane comprises page address, block address, die/chip address, and plane address. A fourth write command sub-sequence sequentially comprises a page program command 0x80, address information of the 3-th plane, page data to be programed of the 3-th plane, and a confirm command such as a confirm command such as the command 0x10 (but not limited), wherein the address information of the 3-th plane comprises page address, block address, die/chip address, and plane address. tProg means the actual page programming time of the flash memory device 110.

By doing so, after receiving the four write command sub-sequences, the flash memory device 110 can know that the 2-th plane is a simulated program failure plane determined by the flash memory controller 105 and the other planes are not fail planes, based on the specific program failure debug command 0x82. In addition, the page address, block address, die/chip address, and plane address can be used to indicate which page/block/die is fail if the specific program failure debug command 0x82 is received. In practice, based on the reception of the specific program failure debug command 0x82, the debug circuit 1111 can perform the write/program operation indicated by the specific program failure debug command 0x82 to correctly write the page data of the 2-th plane into the corresponding addresses in the 2-th plane and merely generate the debug information (including page address, block address, die/chip address, and plane address) into the status register 1113 without controlling the memory cell array 1107 generating errors. It should be noted, in this example, the debug circuit 1111 does not generate corresponding debug information for the 0-th plane, 1-th plane, and 3-th plane since the page program/write commands 0x80 for the 0-th plane, 1-th plane, and 3-th plane are not replaced by a specific program failure debug command 0x82. That is, the flash memory controller 105 can directly determine which plane is a fail plane and instantly control the flash memory device 110 generate debug information of the determined fail plane.

Further, the above operations can be also suitable for different write/program modes such as MLC (multiple-level-cell) mode, TLC (triple-level-cell) mode, or QLC (quad-level-cell) mode, and so on. In the different write/program modes, the flash memory controller 105 can also use and send the specific debug injection program command 0x82 to replace the original write/program command 0x80 so as to indicate generating debug information for a specific plane, die, block, or specific page address.

Figure 10:
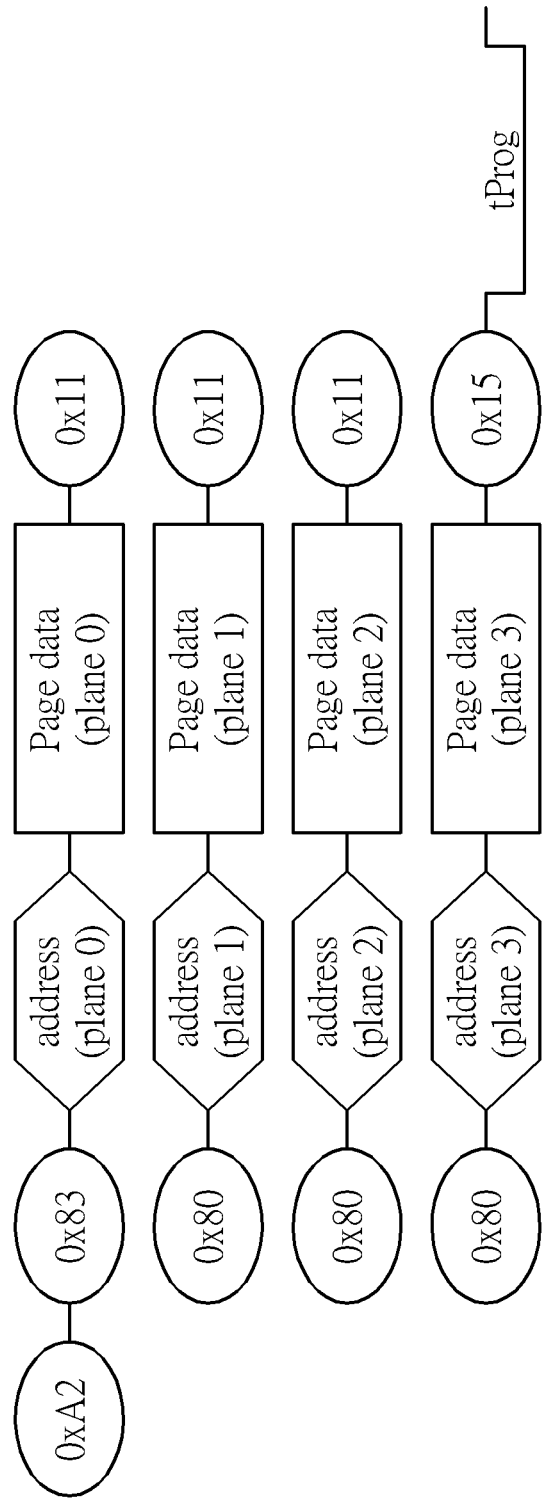
FIG. 10 is a diagram of an example of the flash memory controller sending at least one write/program command signal such as four cache program command sub-sequences to the flash memory device according to another embodiment of the invention.

FIG. 10 is a diagram of an example of the flash memory controller 105 sending at least one write/program command signal such as four cache program command sub-sequences to the flash memory device 110 according to another embodiment of the invention. In FIG. 10, the flash memory controller 105 sequentially sends four write or cache program command sub-sequences to the flash memory device 110. A first write command sub-sequence sequentially comprises an SLC programming instruction/command such as 0xA2 (but not limited), a debug injection cache program command such as 0x83 (which has a function of a write command and can replace a page program command 0x80), five-cycle address information (row and column addresses) of the 0-th plane, page data to be programed of the 0-th plane, and an intermediate confirm command such as a change write command such as the command 0x11 (but not limited), wherein the address information of the 0-th plane comprises page address, block address, die/chip address, and plane address.

A second write command sub-sequence sequentially comprises a page program command 0x80, five-cycle address information of the 1-th plane, page data to be programed of the 1-th plane, and a change write command 0x11, wherein the address information of the 1-th plane comprises page address, block address, die/chip address, and plane address. A third write command sub-sequence sequentially comprises a page program command 0x80, address information of the 2-th plane, page data to be programed of the 2-th plane, and a change write command 0x11, wherein the address information of the 2-th plane comprises page address, block address, die/chip address, and plane address. A fourth write command sub-sequence sequentially comprises a page program command 0x80, address information of the 3-th plane, page data to be programed of the 3-th plane, and a cache write confirm command such as a cache program confirm command such as the command 0x15 (but not limited) different from the command 0x10, wherein the address information of the 3-th plane comprises page address, block address, die/chip address, and plane address. tProg means the actual page programming time of the flash memory device 110.

By doing so, after receiving the four write command sub-sequences, the flash memory device 110 can know that the four write command sub-sequences are used for performing cache program operations for different planes, and knows that the 0-th plane is a simulated cache program failure plane determined by the flash memory controller 105 and the other planes are not fail planes, based on the debug injection cache program command 0x83. In addition, the page address, block address, die/chip address, and plane address can be used to indicate which page/block/die is fail if the cache program failure debug command 0x83 is received. In practice, based on the reception of the debug injection cache program command 0x83, the debug circuit 1111 can perform the cache write (or cache program) operation indicated by the cache program failure debug command 0x83 to correctly write multiple page data of the 0-th plane into the corresponding addresses in the 0-th plane and merely generate the debug information (including page address, block address, die/chip address, and plane address) into the status register 1113 without controlling the memory cell array 1107 generating failure errors. It should be noted, in this example, the debug circuit 1111 does not generate corresponding debug information for the 1-th plane, 2-th plane, and 3-th plane since the page program/write commands 0x80 for the 1-th plane, 2-th plane, and 3-th plane are not replaced by a debug injection cache program command 0x83. That is, the flash memory controller 105 can directly determine which plane is a simulated cache program failure plane and instantly control the flash memory device 110 generate debug information of the determined fail plane.

Further, the above operations can be also suitable for different write/program modes such as MLC (multiple-level-cell) mode, TLC (triple-level-cell) mode, or QLC (quad-level-cell) mode, and so on. In the different write/program modes, the flash memory controller 105 can also use and send the debug injection cache program command 0x83 to replace the original write/program command 0x80 so as to indicate generating debug information for a specific plane, die, block, or specific page address.

Figure 11:
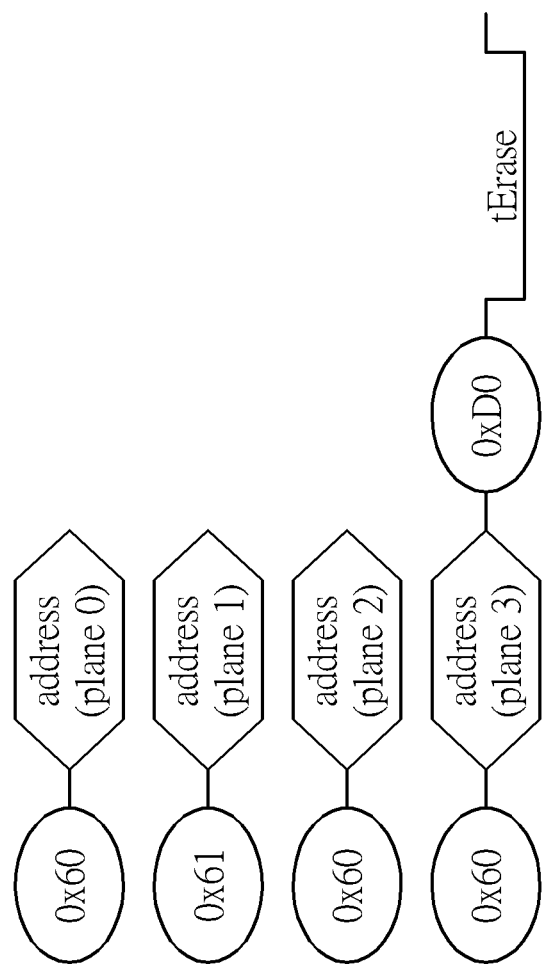
FIG. 11 is a diagram of an example of the flash memory controller sending at least one erase command signal such as four erase command sub-sequences to the flash memory device according to another embodiment of the invention.

FIG. 11 is a diagram of an example of the flash memory controller 105 sending at least one erase command signal such as four erase command sub-sequences to the flash memory device 110 according to another embodiment of the invention. In FIG. 11, the flash memory controller 105 sequentially sends four erase command sub-sequences to the flash memory device 110. A first erase command sub-sequence sequentially comprises an erase command such as 0x60 (i.e. 60h) and three-cycle address information (e.g. block address) of the 0-th plane, wherein the block address indicates the logical address of a data block of the 0-th plane to be erased. A second erase command sub-sequence sequentially comprises a debug injection erase command such as 0x61 (different from an erase command 0x60) and block address information of the 1-th plane, wherein the block address indicates the logical address of a data block of the 1-th plane to be erased. A third erase command sub-sequence sequentially comprises an erase command such as 0x60 (i.e. 60h) and three-cycle block address information of the 2-th plane, wherein the block address information indicates the logical address of a data block of the 2-th plane to be erased. A fourth erase command sub-sequence sequentially comprises an erase command such as 0x60 (i.e. 60h), three-cycle address information (e.g. block address) of the 3-th plane, and an erase confirm command such as the command 0xD0 (i.e. D0h), wherein the block address indicates the logical address of a data block of the 3-th plane to be erased. tErase means the actual block erase time of the flash memory device 110.

By doing so, after receiving the four erase command sub-sequences, the flash memory device 110 can know that the four erase command sub-sequences are used for performing erase operations for different planes, and knows that the 1-th plane is a simulated erase failure plane determined by the flash memory controller 105 and the other planes are not erase failure planes, based on the erase failure debug command 0x61. In addition, the block address information can be used to indicate which block is to be erased and fail if the debug injection erase command 0x61 is received. In practice, based on the reception of the debug injection erase command 0x61, the debug circuit 1111 can perform the erase operation indicated by the debug injection erase command 0x61 to correctly erase block(s) of the 1-th plane and merely generate the debug information (including block address information) into the status register 1113 without controlling the memory cell array 1107 generating errors. It should be noted, in this example, the debug circuit 1111 does not generate corresponding debug information for the 0-th plane, 2-th plane, and 3-th plane since the original erase commands 0x60 for the 0-th plane, 2-th plane, and 3-th plane are not replaced by a debug injection erase command 0x61. That is, the flash memory controller 105 can directly determine which plane is a simulated erase failure plane and instantly control the flash memory device 110 generate debug information of the determined fail plane.

It should be noted that in other embodiments the debug injection program command, debug injection cache program command, and/or the debug injection erase command can be implemented by using other different command(s) which can be configured to be different from a standard command (or a vendor specific command) and may be implemented by using reserved command(s) such as 0Bh, 12h, 14h, 18h, 1Bh-1Ch, 62h-64h, AAh, 76h, 82h-83h, 86h, and 8Eh wherein 'h' means hexadecimal. the following table shows the different examples of the reserved commands which can be used to implement the command(s):

| Type | Opcode |
| --- | --- |
| Standard Command Set | 00h, 05h-06h, 10h-11h, 15h, 30h-32h, 35h, 3Fh, 60h, 70h, 78h, 80h-81h, 85h, 90h, D0h-D1h, D4h-D5h, D9h, E0h-E2h, ECh-EFh, F1h-F2h, F9h, FAh, FCh, FFh |
| Vendor Specific | 01h-04h, 07h-0Ah, 0Ch-0Fh, 13h, 16h-17h, 19h-1Ah, 1Dh-2Fh, 33h-34h, 36h-3Eh, 40h-5Fh, 61h, 65h-6Fh, 71h-75h, 77h, 79h-7Fh, 84h, 87h-8Dh, 8Fh, 91h-CFh, D2h-D3h, D6h-D8h, DAh-DFh, E3h-E8h, F0h, F3h-F8h, FBh, FD-FEh |
| Reserved | 0Bh, 12h, 14h, 18h, 1Bh-1Ch, 62h-64h, 76h, 82h-83h, B6h, 8Eh |

Fourth Control Scheme:

In the embodiments of the fourth control scheme, in addition to generating the debug information in the above-mentioned operations of the third control scheme, the flash memory controller 105 can control the flash memory device 110 automatically making the memory cell array 1107 actually generate program (cache program or erase) failure errors. The flash memory controller 105 can send one or more specific error injection commands to trigger the error handle debug operation of the flash memory device 110 so that the flash memory device 110 can instantly and automatically generate and write the debug information (debug information associated of true program failure, true erase failure, and/or true cache program failure) into its status register 1113 and transmit the debug information back to the flash memory controller 105 with actually controlling its memory cell array 1107 generating failure errors, i.e. not passing the generation of errors.

Through the bidirectional communications/operations (including that the flash memory controller 105 controls the flash memory device 110 automatically generating debug information and that the flash memory device 110 transmits the generated debug information back to the flash memory controller 105) and actually controlling its memory cell array 1107 generating failure errors, the test result of the error handle debug operation performed by the flash memory controller 105 can be more rapid, correct, and accurate.

In the embodiments of the fourth control scheme, the flash memory controller 105 can send a specific error injection command signal to control the flash memory device 110 performing a corresponding processing operation (e.g. program, cache program or erase) of the specific error injection command signal and also instantly generating and reporting debug information of the corresponding processing operation back to the flash memory controller 105, with actually controlling its memory cell array 1107 generating errors.

Figure 12:
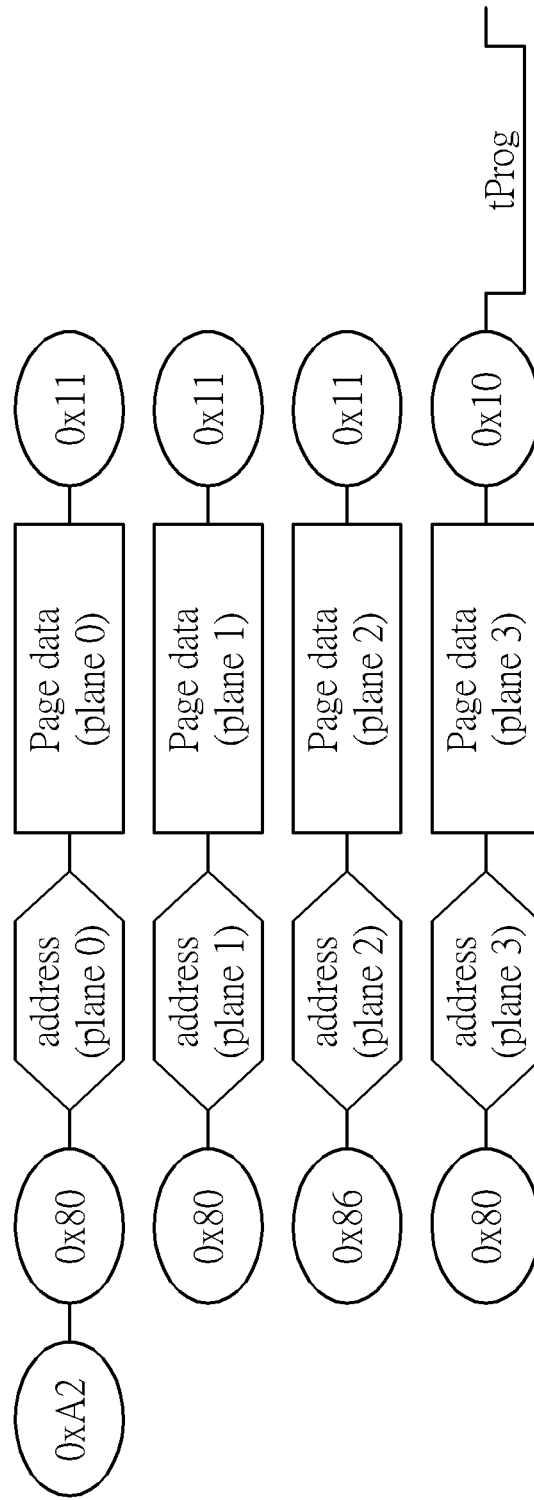
FIG. 12 is a diagram of an example of the flash memory controller sending at least one write/program command signal such as four write/program command sub-sequences to the flash memory device according to an embodiment of the invention.

FIG. 12 is a diagram of an example of the flash memory controller 105 sending at least one write/program command signal such as four write/program command sub-sequences to the flash memory device 110 according to an embodiment of the invention. In FIG. 12, the flash memory controller 105 sequentially sends four write command sub-sequences to the flash memory device 110. For example (but not limited), a first write command sub-sequence sequentially comprises an SLC programming instruction/command such as 0xA2 (but not limited), a page program command such as the command 0x80 (but not limited), five-cycle address information (row and column addresses) of the 0-th plane, page data to be programed of the 0-th plane, and an intermediate confirm command such as a change write command such as the command 0x11 (but not limited), wherein the address information of the 0-th plane comprises page address, block address, die/chip address, and plane address.

A second write command sub-sequence sequentially comprises a page program command 0x80, five-cycle address information of the 1-th plane, page data to be programed of the 1-th plane, and a change write command 0x11, wherein the address information of the 1-th plane comprises page address, block address, die/chip address, and plane address. A third write command sub-sequence sequentially comprises a specific error injection program command such as 0x86 (which has a function of a page program command 0x80 to replace a page program command 0x80 and is different from the debug injection program command 0x82 in the third control scheme), address information of the 2-th plane, page data to be programed of the 2-th plane, and a change write command 0x11, wherein the address information of the 2-th plane comprises page address, block address, die/chip address, and plane address. A fourth write command sub-sequence sequentially comprises a page program command 0x80, address information of the 3-th plane, page data to be programed of the 3-th plane, and a write confirm command such as a confirm command such as the command 0x10 (but not limited), wherein the address information of the 3-th plane comprises page address, block address, die/chip address, and plane address. tProg means the actual page programming time of the flash memory device 110.

By doing so, after receiving the four write command sub-sequences, the flash memory device 110 can know that the 2-th plane is a true program failure plane determined by the flash memory controller 105 and the other planes are not fail planes, based on the specific error injection program command such as 0x86. In addition, the page address, block address, die/chip address, and plane address can be used to indicate which page/block/die is actually fail if the specific error injection program command 0x86 is received. In practice, based on the reception of the specific error injection program command 0x86, the debug circuit 1111 can perform the write/program operation indicated by the specific error injection program command 0x86 to fail to correctly write the page data of the 2-th plane into the corresponding addresses in the 2-th plane, and it correctly generates the debug information (including page address, block address, die/chip address, and plane address) into the status register 1113, i.e. controlling the memory cell array 1107 generating errors at the indicated page address, block address, die/chip address, and plane address. It should be noted, in this example, the debug circuit 1111 does not generate corresponding debug information for the 0-th plane, 1-th plane, and 3-th plane since the page program/write commands 0x80 for the 0-th plane, 1-th plane, and 3-th plane are not replaced by a specific error injection program command 0x86. That is, the flash memory controller 105 can directly determine which plane is a fail plane and instantly control the flash memory device 110 generate debug information of the determined fail plane and errors.

Further, the above operations can be also suitable for different write/program modes such as MLC (multiple-level-cell) mode, TLC (triple-level-cell) mode, or QLC (quad-level-cell) mode, and so on. In the different write/program modes, the flash memory controller 105 can also use and send the specific error injection program command 0x86 to replace the original write/program command 0x80 so as to indicate generating debug information and errors for a specific plane, die, block, or specific page address.

Figure 13:
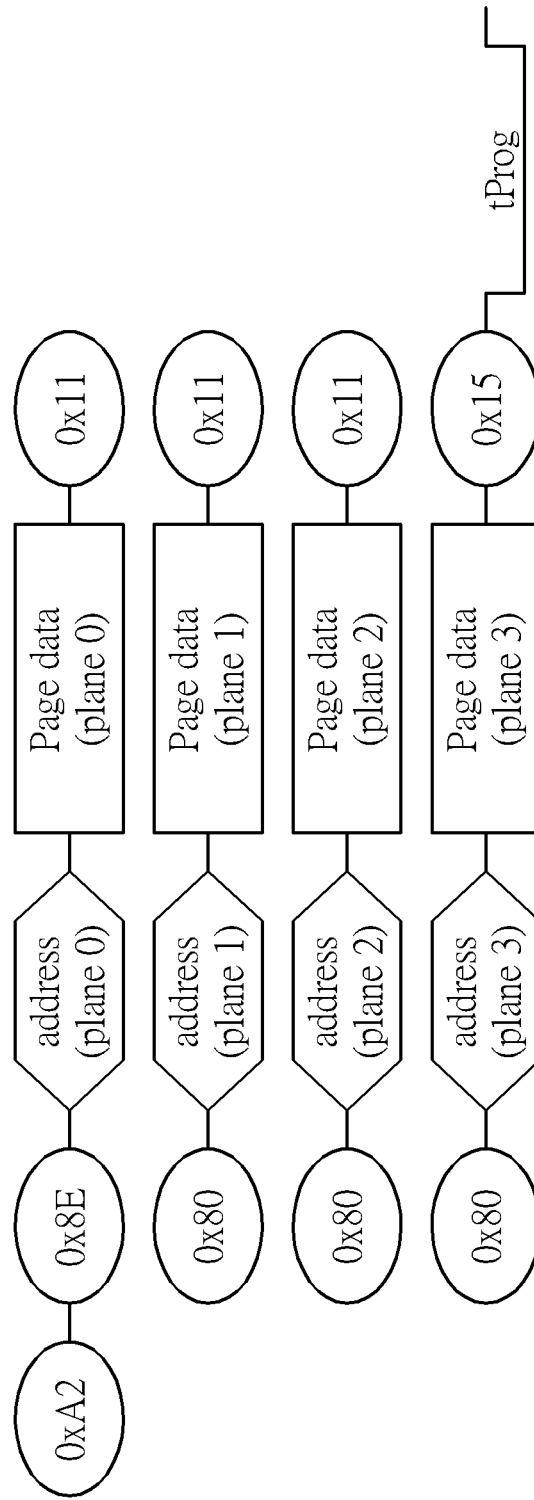
FIG. 13 is a diagram of an example of the flash memory controller sending at least one write/program command signal such as four cache program command sub-sequences to the flash memory device according to another embodiment of the invention.

FIG. 13 is a diagram of an example of the flash memory controller 105 sending at least one write/program command signal such as four cache program command sub-sequences to the flash memory device 110 according to another embodiment of the invention. In FIG. 13, the flash memory controller 105 sequentially sends four write or cache program command sub-sequences to the flash memory device 110. A first write command sub-sequence sequentially comprises an SLC programming instruction/command such as 0xA2 (but not limited), an error injection cache program command such as 0x8E (which has a function of a write command and can replace a page program command 0x80, and it is different from a debug injection cache program command), five-cycle address information (row and column addresses) of the 0-th plane, page data to be programed of the 0-th plane, and an intermediate confirm command such as a change write command such as the command 0x11 (but not limited), wherein the address information of the 0-th plane comprises page address, block address, die/chip address, and plane address.

A second write command sub-sequence sequentially comprises a page program command 0x80, five-cycle address information of the 1-th plane, page data to be programed of the 1-th plane, and a change write command 0x11, wherein the address information of the 1-th plane comprises page address, block address, die/chip address, and plane address. A third write command sub-sequence sequentially comprises a page program command 0x80, address information of the 2-th plane, page data to be programed of the 2-th plane, and a change write command 0x11, wherein the address information of the 2-th plane comprises page address, block address, die/chip address, and plane address. A fourth write command sub-sequence sequentially comprises a page program command 0x80, address information of the 3-th plane, page data to be programed of the 3-th plane, and a cache write confirm command such as a cache program confirm command such as the command 0x15 (but not limited) different from the command 0x10, wherein the address information of the 3-th plane comprises page address, block address, die/chip address, and plane address. tProg means the actual page programming time of the flash memory device 110.

By doing so, after receiving the four write command sub-sequences, the flash memory device 110 can know that the four write command sub-sequences are used for performing cache program operations for different planes, and knows that the 0-th plane is a true cache program failure plane determined by the flash memory controller 105 and the other planes are not fail planes, based on the error injection cache program command 0x8E. In addition, the page address, block address, die/chip address, and plane address can be used to indicate which page/block/die is fail if the error injection cache program command 0x8E is received. In practice, based on the reception of the error injection cache program command 0x8E, the debug circuit 1111 can perform the cache write (or cache program) operation indicated by the error injection cache program command 0x8E to fail to correctly write multiple page data of the 0-th plane into the corresponding addresses in the 0-th plane, and it correctly generates the debug information (including page address, block address, die/chip address, and plane address) into the status register 1113, i.e. actually controlling the memory cell array 1107 generating errors. It should be noted, in this example, the debug circuit 1111 does not generate corresponding debug information for the 1-th plane, 2-th plane, and 3-th plane since the page program/write commands 0x80 for the 1-th plane, 2-th plane, and 3-th plane are not replaced by an error injection cache program command 0x8E. That is, the flash memory controller 105 can directly determine which plane is a true cache program failure plane and instantly control the flash memory device 110 generate debug information and errors of the determined fail plane.

Further, the above operations can be also suitable for different write/program modes such as MLC (multiple-level-cell) mode, TLC (triple-level-cell) mode, or QLC (quad-level-cell) mode, and so on. In the different write/program modes, the flash memory controller 105 can also use and send the error injection cache program command 0x8E to replace the original write/program command 0x80 so as to indicate generating debug information and errors for a specific plane, die, block, or specific page address.

Figure 14:
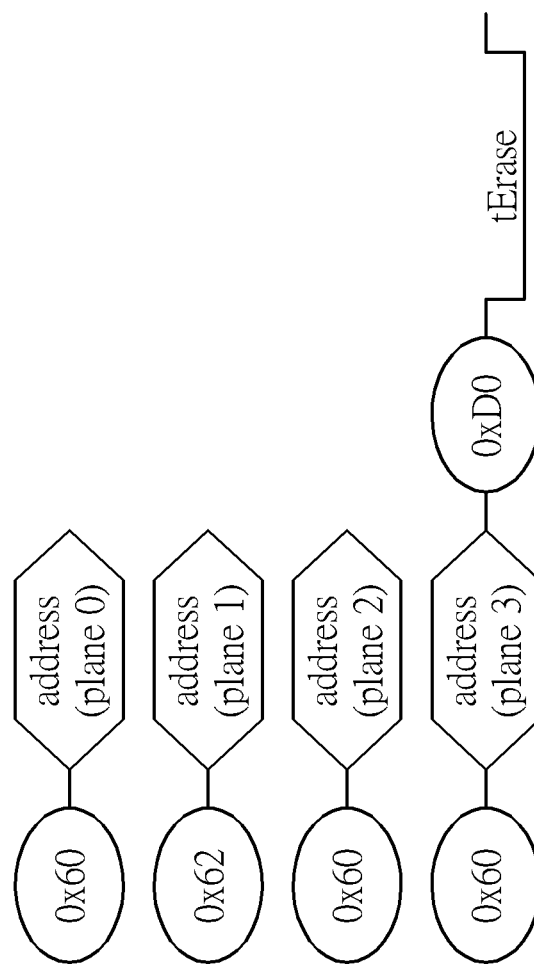
FIG. 14 is a diagram of an example of the flash memory controller sending at least one erase command signal such as four erase command sub-sequences to the flash memory device according to another embodiment of the invention.

FIG. 14 is a diagram of an example of the flash memory controller 105 sending at least one erase command signal such as four erase command sub-sequences to the flash memory device 110 according to another embodiment of the invention. In FIG. 14, the flash memory controller 105 sequentially sends four erase command sub-sequences to the flash memory device 110. A first erase command sub-sequence sequentially comprises an erase command such as 0x60 (i.e. 60h) and three-cycle address information (e.g. block address) of the 0-th plane, wherein the block address indicates the logical address of a data block of the 0-th plane to be erased. A second erase command sub-sequence sequentially comprises an error injection erase command such as 0x62 (different from an erase command 0x60 and also different from a debug injection erase command such as 0x61) and block address information of the 1-th plane, wherein the block address indicates the logical address of a data block of the 1-th plane to be erased. A third erase command sub-sequence sequentially comprises an erase command such as 0x60 (i.e. 60h) and three-cycle block address information of the 2-th plane, wherein the block address information indicates the logical address of a data block of the 2-th plane to be erased. A fourth erase command sub-sequence sequentially comprises an erase command such as 0x60 (i.e. 60h), three-cycle address information (e.g. block address) of the 3-th plane, and an erase confirm command such as the command 0xD0 (i.e. D0h), wherein the block address indicates the logical address of a data block of the 3-th plane to be erased. tErase means the actual block erase time of the flash memory device 110.

By doing so, after receiving the four erase command sub-sequences, the flash memory device 110 can know that the four erase command sub-sequences are used for performing erase operations for different planes, and knows that the 1-th plane is a true erase failure plane determined by the flash memory controller 105 and the other planes are not erase failure planes, based on the error injection erase command 0x62. In addition, the block address information can be used to indicate which block is to be erased and fail if the error injection erase command 0x62 is received. In practice, based on the reception of the error injection erase command 0x62, the debug circuit 1111 can perform the erase operation indicated by the error injection erase command 0x62 to fail to correctly erase block(s) of the 1-th plane, and it correctly generates the debug information (including block address information) into the status register 1113, i.e. controlling the memory cell array 1107 generating errors. It should be noted, in this example, the debug circuit 1111 does not generate corresponding debug information for the 0-th plane, 2-th plane, and 3-th plane since the original erase commands 0x60 for the 0-th plane, 2-th plane, and 3-th plane are not replaced by an erase failure error injection command 0x62. That is, the flash memory controller 105 can directly determine which plane is a true erase failure plane and instantly control the flash memory device 110 generate debug information and errors of the determined fail plane.

Further, in practice, to control the memory cell array 1107 generating failure errors actually, the debug circuit 1111 can control the voltage generator 1104 outputting different voltage levels (provided for the control gate(s) of the memory cell array 1107) and/or different voltage time periods. For example (but not limited), in a normal program operation, the voltage generator 1104 is arranged to generate and apply different voltage levels upon a control gate until a threshold voltage of a cell unit in a specific page/block/plane becomes equal to an expected voltage level. When receiving an error injection command signal mentioned above, to actually generate a true program failure error (a true cache program error or a true erase failure error) occurring in the cell unit, the debug circuit 1111 may control the voltage generator 1104 adjusting the voltage levels upon the control gate to make the threshold voltage of the cell unit be not enough or be too much high. Alternatively, the debug circuit 1111 may control the voltage generator 1104 stopping the output of the voltage levels. Alternatively, the debug circuit 1111 may control the voltage generator 1104 adjusting the voltage time period to make the operation of controlling the voltage level upon the control gate becomes timeout.

Further, in other embodiments, the above-mentioned control schemes can be combined. The flash memory controller 105 can send set-feature signal(s) to enable and configure the operations of the debug circuit 1111 and can also send corresponding access command signal(s) to instantly control/trigger the debug circuit 1111 generating debug information and/or errors.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of a flash memory device to be used in a storage device and coupled to a flash memory controller of the storage device through a specific communication interface, and the method comprises:
providing an input/output (I/O) control circuit, coupled to the flash memory controller through the specific communication interface;
providing a command register, coupled to the I/O control circuit, for buffering command information sent from the flash memory controller and transmitted through the I/O control circuit;
providing an address register, coupled to the I/O control circuit, for buffering address information sent from the flash memory controller and transmitted through the I/O control circuit;
providing a memory cell array, at least having a first plane and a second plane which is different from the first plane;

providing at least one address decoder, coupled to the memory cell array;
providing a status register, coupled to the I/O control circuit;
providing a voltage generator, coupled to the memory cell array;
using a debug circuit to generate debug information of an access operation in response to a reception of an error injection access command signal sent from the flash memory controller with controlling the voltage generator making the memory cell array generate errors; and
transmitting the generated debug information into the status register and controlling the status register transmitting the debug information from the flash memory device to the flash memory controller via the I/O control circuit and the specific communication interface;
wherein the access operation is a program operation; the debug information is associated with a true program failure, and the debug circuit controls the memory cell array generating a program failure error; the error injection access command signal sequentially comprises a specific error injection program command, address information of a specific plane, page data to be programmed of the specific plane, and a change write command or a confirm command; the address information of the specific plane comprises page address, block address, die or chip address, and plane address; and, the access operation is the program operation; the debug circuit does not generate the debug information and does not control the voltage generator making the memory cell array generate errors if receiving a program command signal which sequentially comprises a program command, the address information of the specific plane, the page data to be programmed of the specific plane, and the change write command or the confirm command.

2. The method of claim 1, wherein the specific error injection program command has a program function of a page program command and is different from the page program command to replace the page program command.

3. A method of a flash memory device to be used in a storage device and coupled to a flash memory controller of the storage device through a specific communication interface, and the method comprises:
providing an input/output (I/O) control circuit, coupled to the flash memory controller through the specific communication interface;
providing a command register, coupled to the I/O control circuit, for buffering command information sent from the flash memory controller and transmitted through the I/O control circuit;
providing an address register, coupled to the I/O control circuit, for buffering address information sent from the flash memory controller and transmitted through the I/O control circuit;
providing a memory cell array, at least having a first plane and a second plane which is different from the first plane;
providing at least one address decoder, coupled to the memory cell array;
providing a status register, coupled to the I/O control circuit;
providing a voltage generator, coupled to the memory cell array;
using a debug circuit to generate debug information of an access operation in response to a reception of an error injection access command signal sent from the flash memory controller with controlling the voltage generator making the memory cell array generate errors; and
transmitting the generated debug information into the status register and controlling the status register transmitting the debug information from the flash memory device to the flash memory controller via the I/O control circuit and the specific communication interface;
wherein the access operation is an erase operation; the debug information is associated with a true erase failure, and the debug circuit controls the memory cell array generating an erase failure error; the error injection access command signal sequentially comprises a specific error injection erase command and block address information of a specific plane, wherein the block address information of the specific plane comprises a logical address of a data block of the specific plane to be erased; the debug circuit does not generate the debug information and does not control the memory cell array generating errors if receiving an erase command signal which sequentially comprises an erase command and the block address information of the specific plane.

4. The method of claim 3, wherein the specific error injection erase command has an erase function of the erase command and is different from the erase command to replace the erase command.

5. A flash memory controller to be used in a storage device and coupled to a flash memory device of the storage device through a specific communication interface, comprising:
an input/output (I/O) circuit, coupled to the flash memory device through the specific communication interface, for sending commands and data between the flash memory device and a processor; and
the processor, coupled to the I/O circuit, for controlling the I/O circuit sending an error injection access command signal to the flash memory device through the specific communication interface to make the flash memory device's debug circuit generate debug information of an access operation of the error injection access command signal sent from the flash memory controller, transmit the generated debug information from the flash memory device to the flash memory controller via the I/O control circuit and the specific communication interface, with controlling a memory cell array of flash memory device generating errors;
wherein the access operation is a program operation; the debug information is associated with a true program failure, and the debug circuit controls the memory cell array generating a program failure error; the error injection access command signal sequentially comprises a specific error injection program command, address information of a specific plane, page data to be programmed of the specific plane, and a change write command or a confirm command; the address information of the specific plane comprises page address, block address, die or chip address, and plane address; and, the access operation is the program operation; the flash memory device's debug circuit does not generate the debug information and does not control the voltage generator making the memory cell array generate errors if receiving a program command signal which sequentially comprises a program command, the address information of the specific plane, the page data to be programmed of the specific plane, and the change write command or the confirm command.

6. The flash memory controller of claim 5, wherein the specific error injection program command has a program function of a page program command and is different from the page program command to replace the page program command.

7. A flash memory controller to be used in a storage device and coupled to a flash memory device of the storage device through a specific communication interface, comprising:

an input/output (I/O) circuit, coupled to the flash memory device through the specific communication interface, for sending commands and data between the flash memory device and a processor; and the processor, coupled to the I/O circuit, for controlling the I/O circuit sending an error injection access command signal to the flash memory device through the specific communication interface to make the debug circuit generate debug information of an access operation of the error injection access command signal sent from the flash memory controller, transmit the generated debug information from the flash memory device to the flash memory controller via the I/O control circuit and the specific communication interface, with controlling a memory cell array of flash memory device generating errors;

wherein the access operation is an erase operation; the debug information is associated with a true erase failure, and the debug circuit controls the memory cell array generating an erase failure error; the error injection access command signal sequentially comprises a specific error injection erase command and block address information of a specific plane, wherein the block address information of the specific plane comprises a logical address of a data block of the specific plane to be erased; the flash memory device's debug circuit does not generate the debug information and does not control the memory cell array generating errors if receiving an erase command signal which sequentially comprises an erase command and the block address information of the specific plane.

8. The flash memory controller of claim 7, wherein the specific error injection erase command has an erase function of the erase command and is different from the erase command to replace the erase command.

* * * * *